United States Patent
Hussain et al.

(10) Patent No.: US 12,155,135 B2
(45) Date of Patent: Nov. 26, 2024

(54) SHARED APERTURE FOLDED DIPOLE ANTENNA

(71) Applicant: KING FAHD UNIVERSITY OF PETROLEUM AND MINERALS, Dhahran (SA)

(72) Inventors: Rifaqat Hussain, Dhahran (SA); Abdul Rehman Chishti, Dhahran (SA); Abdul Aziz, Dhahran (SA); Abdullah Al-Garni, Dhahran (SA); Sharif Iqbal Mitu Sheikh, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 147 days.

(21) Appl. No.: 18/183,796

(22) Filed: Mar. 14, 2023

(65) Prior Publication Data

US 2024/0313408 A1    Sep. 19, 2024

(51) Int. Cl.
*H01Q 9/26*   (2006.01)
*H01Q 5/321*  (2015.01)
*H01Q 5/35*   (2015.01)
*H01Q 9/06*   (2006.01)
(Continued)

(52) U.S. Cl.
CPC ............... *H01Q 9/26* (2013.01); *H01Q 5/321* (2015.01); *H01Q 5/35* (2015.01); *H01Q 9/065* (2013.01); *H05K 3/1283* (2013.01); *H01Q 1/273* (2013.01)

(58) Field of Classification Search
CPC ........ H01Q 1/273; H01Q 1/276; H01Q 5/307; H01Q 5/314; H01Q 5/321; H01Q 5/342; H01Q 5/35; H01Q 9/16; H01Q 9/26; H01Q 9/065; H05K 3/1283
See application file for complete search history.

(56) References Cited

U.S. PATENT DOCUMENTS

| | | | |
|---|---|---|---|
| 8,412,290 B2 | 4/2013 | Shamim et al. | |
| 2006/0061515 A1* | 3/2006 | Poslusnzy | H01Q 9/285 343/803 |
| 2008/0186245 A1* | 8/2008 | Hilgers | H01Q 1/22 343/803 |

OTHER PUBLICATIONS

Haider, et al. ; Recent Developments in Reconfigurable and Multiband Antenna Technology ; International Jorunal of Antennas and Propagation vol. 2013 ; Jan. 30, 2013 ; 15 Pages.
(Continued)

*Primary Examiner* — Robert Karacsony
(74) *Attorney, Agent, or Firm* — Oblon, McClelland, Maier & Neustadt, L.L.P.

(57) ABSTRACT

A shared aperture multi-band antenna is described. The antenna includes a dielectric circuit board, a folded dipole microstrip antenna, and a lumped inductor. The folded dipole microstrip antenna is formed on a top side of the dielectric circuit board. The microstrip antenna includes two meander paths. The two meander paths enclose a shared aperture therebetween. The lumped inductor is inserted across a first gap near the third edge. A first pair of parallel metallic patches, a second pair of parallel metallic patches, and a third pair of parallel metallic patches are located on the bottom side. The antenna resonates in a dual band frequency range comprising a first resonance band in a range of 0.4 GHz to 0.6 GHz and a second resonance band in a range of 4.7 GHZ to 5.8 GHz upon application of an input signal at both a first feed port and a second feed port.

20 Claims, 9 Drawing Sheets

(51) Int. Cl.
*H05K 3/12* (2006.01)
*H01Q 1/27* (2006.01)

(56) References Cited

OTHER PUBLICATIONS

Haider, et al. ; A Shared Aperture Microstrip Antenna Array with Multiple Polarisations and Near-Field Beam Steering ; TechRxiv ; Jul. 1, 2022 ; 17 Pages.
Smolders, et al. ; A Shared Aperture Dual-Frequency Circularly Polarized Microstrip Array Antenna ; IEEE Antennas and Wireless Propagation Letters, vol. 12. ; Jan. 2013 ; 5 Pages.

* cited by examiner

SHARED APERTURE FOLDED DIPOLE ANTENNA

BACKGROUND

Technical Field

The present disclosure is directed to a shared aperture multi-band antenna.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Antennas play an important role in wireless communication, especially in 5G communication and biomedical applications. Applications may include antenna integration inside cars, satellite, automobiles, and aircraft. Antennas used for biomedical purposes not only serve as a medical device to transmit information but may perform user monitoring and tracking. There has been enormous development in biomedical applications as antenna sensors can be used to monitor various parameters associated with a human body such as temperature, glucose monitoring, heart rate, and so on. It is essential that the medical devices are miniaturized to alleviate the rejection of implants and pain of patients. The design of a medical device includes parameters such as miniaturization, biocompatibility, patient safety, improvement in communication quality, and the like. Therefore, miniaturization is required to integrate the antenna within small devices.

The frequency bands used for biomedical antennas are medical implant communications systems (MICS) (401-406) MHz and industrial, scientific and medical (ISM) band (2.45 GHZ, 902.8-928) MHz. Other recommended bands include 433-434 MHz, 608-614 MHz, 868-868.6 MHz, 902.9-928 MHZ, 1395-1400 MHZ, 1427-1432 MHz and 2.4-2.5 GHZ. Moreover, the THz frequency band is gaining in popularity, with antennas designed at 430 to 750 THz, 3.6-7.4 THz and 8.25-10.0 THz.

5G is evolving, therefore a communications system is required to cover the frequency bands of 4G as well of 5G. To improve system integration and reduce the number of antennas, many technologies, such as ultra-wideband (UWB) technology, use shared aperture antenna technology and multi-band antenna technology are used in the communication system. For 5G communication, new bands include sub-6 GHz and millimeter-wave (mm-wave) to achieve wireless communication with higher capacity. Hence future standards demand the integration of dual/multi-band antennas in a single communication system that combines 5G microwave and millimeter waves. Conventionally, two independent antennas are placed in proximate to each other to realize the dual or multi band antennas behavior. However, the large areas occupied by these antennas result in low aperture utilization efficiency. Therefore, a shared aperture antenna is used in which two or more antennas working at different frequency bands are integrated into a common radiating topology, thus providing compact size, higher efficiency and low mass. Shared aperture has several applications in base station, wireless communication, RFIDs and aperture radars. The integration of multiple antennas into a single antenna using a shared aperture is challenging, due to the spacing and element size of radiating elements and the suppression of the interference between antennas operating at same or across bands of frequencies. To simplify shared aperture designs, microstrip antennas are considered to be the most feasible and popular due to their low mass along with their integration with the feeding network.

As size and performance of antenna are correlated, achieving a good antenna performance with a miniaturized structure is a challenge. Miniaturization of antennas leads to an electrically small antenna (ESA). The ESA has largest dimensions of less than $\frac{1}{10}^{th}$ of a targeted wavelength. Thus, a $\Delta/10$ length of a dipole, a diameter of a loop or a diagonal dimension of a patch can be used when designing an ESA. However, design of the ESA requires an appropriate impedance matching network depending on the application. Due to its small dimensions, ESAs are limited in radiation efficiency, narrow bandwidth, and negative gain. Designing an ESA is a difficult task, as the quality (Q) factor of the ESA antennas is high, and efforts are required to lower the Q factor. In addition, the ESA faces bandwidth limitation as the Q factor is inversely related to antenna bandwidth. Moreover, losses occur due to the impedance matching of the ESA, which degrade the ESA efficiency.

The Q factor of an antenna is defined as the ratio of a resonator's center frequency to its bandwidth when subject to an oscillating driving force. However, there is a lower limit on the Q factor based on the size and performance of an antenna, therefore achieving good antenna performance with a miniaturized structure is a challenge.

An existing singly fed, electrically small, planar antenna was described that has dimensions $0.165 \times 0.164 \times 0.006 \lambda^3$ at 2.4 GHz. (See: J. Ouyang, Y. Pan, S. Zheng, P. Hu, "*An electrically small planar quasi-isotropic antenna*", IEEE, incorporated herein by reference in its entirety). However, the planar antenna of this reference does not resonate in a sub GHz second frequency. Another existing low-profile triband antenna suitable for 5G massive MIMO applications was described having dimensions of $0.69\lambda_L \times 0.69\lambda_L \times 0.177\lambda_L$ operating in the 0.69-0.96 GHZ, 1.8-2.7 GHZ, and 3.3-3.8 GHz frequency bands, where $\lambda_L$ is the free-space wavelength at 0.69 GHz. (See: Donglin He, Yikai Chen, Shiwen Yang, "*A low-profile triple-band shared-aperture antenna array for 5G base station applications*" IEEE, incorporated herein by reference in its entirety). The free-space wavelength is related to the physical dimensions of an antenna. As an example, an unloaded antenna designed to resonate at a frequency of 0.69 GHz would be about 43 cm long, as $\lambda_L = c/f$, where c is the speed of light and f is the frequency. Thus, the dimensions of this antenna are in the centimeter range.

Further, a shared aperture antenna suitable for 5G based IoT devices was described that covers the eight bands from 1 GHz up to 5.6 GHz providing minimum bandwidth of 1 GHZ (See: Rifaqat Hussain, "*Shared-aperture slot-based sub-6-GHz and mm-wave IoT antenna for 5G applications*, IEEE, incorporated herein by reference in its entirety). However, the shared aperture antenna of this reference does not resonate at sub-1 GHz frequencies.

However, the systems and methods described in these references and other conventional antennas suffer from various limitations including larger size, required specific design (tapered and rectangular slots), and complicated structure.

Hence, there is a need for a shared aperture multi-band antenna that is configured for use with biomedical and 5G communication applications, operates in multiple frequency bands, has a small size, and requires no specific devices for impedance matching.

SUMMARY

In an embodiment, a shared aperture multi-band antenna is described. The shared aperture multi-band antenna includes a dielectric circuit board, a folded dipole microstrip antenna, a first pair of parallel metallic patches, a first feed port, a second pair of parallel metallic patches, a second feed port, and a third pair of parallel metallic patches. The dielectric circuit board includes a top side, a bottom side, a first edge, a second edge parallel to the first edge, a third edge perpendicular to the first edge and the second edge, and a fourth edge parallel to the third edge, a first central axis which extends from the first edge to the second edge, and a second central axis which extends from the third edge to the fourth edge. The folded dipole microstrip antenna is formed on the top side. The folded dipole microstrip antenna includes two meander paths, each having mirror geometry about the second central axis. The two meander paths enclose a shared aperture therebetween. A first gap is located between the two meander paths near the third edge. A second gap is located between the two meander paths near the fourth edge. A lumped inductor is inserted across the first gap near the third edge. The first pair of parallel metallic patches is located on the bottom side. The first pair of parallel metallic patches extends from the first edge towards the second central axis. The first pair of parallel metallic patches has a mirror geometry about the first central axis. The first feed port is connected by a first feed port terminal to a first patch of the first pair of metallic patches at the first edge. The first patch of the first pair of metallic patches is located near the third edge. The first feed port is connected by a second feed port terminal to the dielectric circuit board. The second pair of parallel metallic patches is located on the bottom side. The second pair of parallel metallic patches extends for a second length from the third edge towards the fourth edge. The second pair of parallel metallic patches has mirror geometry about the second central axis. The second feed port is connected by a first feed port terminal to a first patch of the second pair of metallic patches at the third edge. The first patch of the second pair of metallic patches is located between the first patch of the first pair of metallic patches and the second central axis. The second feed port is connected by a second feed port terminal to the dielectric circuit board. The third pair of parallel metallic patches located on the bottom side, wherein the third pair of parallel metallic patches extends from the second edge towards the second central axis. The third pair of parallel metallic patches have a mirror geometry about the first central axis. The shared aperture multi-band antenna is configured to resonate in a dual band frequency range comprising a first resonance band in a range of 0.4 GHz to 0.6 GHz and a second resonance band in a range of 4.7 GHz to 5.8 GHz upon application of an input signal at both the first feed port and the second feed port.

In another exemplary embodiment, a method for making a shared aperture multi-band antenna is described. The method includes obtaining a dielectric circuit board including a top side, a bottom side, a first edge, a second edge parallel to the first edge, a third edge perpendicular to the first edge and the second edge, and a fourth edge parallel to the third edge, a first central axis which extends from the first edge to the second edge, and a second central axis which extends from the third edge to the fourth edge. The method includes printing, with metal, a folded dipole microstrip antenna on the top side, wherein the folded dipole microstrip antenna consists of two meander paths, each having mirror geometry about the second central axis, wherein the two meander paths enclose a shared aperture therebetween. The method includes leaving a first gap between the two meander paths near the third edge. The method includes leaving a second gap between the two meander paths near the fourth edge. The method includes inserting a lumped inductor across the first gap near the third edge. The method includes printing, with metal, a first pair of parallel metallic patches on the bottom side, wherein the first pair of parallel metallic patches extends from the first edge towards the second central axis, wherein the first pair of parallel metallic patches has a mirror geometry about the first central axis. The method includes connecting a first feed port terminal of the first feed port to a first patch of the first pair of metallic patches at the first edge, wherein the first patch of the first pair of metallic patches is located near the third edge. The method includes connecting a second feed port terminal of the first feed port to the dielectric circuit board. The method includes printing, with metal, a second pair of parallel metallic patches on the bottom side, wherein the second pair of parallel metallic patches extends for a second length from the third edge towards the fourth edge, wherein the second pair of parallel metallic patches has mirror geometry about the second axis. The method includes connecting a first feed port terminal of a second feed port to a first patch of the second pair of metallic patches at the third edge, wherein the first patch of the second pair of metallic patches is located between the first patch of the first pair of metallic patches and the second central axis. The method includes connecting a second feed port terminal of the second feed port to the dielectric circuit board. The method includes printing, with metal, a third pair of parallel metallic patches on the bottom side, wherein the third pair of parallel metallic patches extends from the second edge towards the second central axis, wherein the third pair of parallel metallic patches has a mirror geometry about the first central axis. The method includes applying a first input signal at the first feed port and a second input signal at the second feed port, wherein the first input signal and the second input signal cause the shared aperture multi-band antenna to resonate in a dual band frequency range comprising a first resonance band in a range of 0.4 GHz to 0.6 GHz and a second resonance band in a range of 4.7 GHZ to 5.8 GHz.

In another exemplary embodiment, a method for transmitting signals with a shared aperture multi-band antenna is described. The method includes connecting an input signal to a first feed port and a second feed port located on the shared aperture multi-band antenna, wherein the shared aperture multi-band antenna includes a dielectric circuit board including a top side, a bottom side, a first edge, a second edge parallel to the first edge, a third edge perpendicular to the first edge and the second edge, and a fourth edge parallel to the third edge, a first central axis which extends from the first edge to the second edge, and a second central axis which extends from the third edge to the fourth edge, a folded dipole microstrip antenna formed on the top side, wherein the folded dipole microstrip antenna consists of two meander paths, each having mirror geometry about the second central axis, wherein the two meander paths enclose a shared aperture therebetween, a first gap located between the two meander paths near the third edge, a second gap located between the two meander paths near the fourth edge, a lumped inductor inserted across the first gap near the third edge, a first pair of parallel metallic patches located on the bottom side, wherein the first pair of parallel metallic patches extends from the first edge towards the second central axis, wherein the first pair of parallel metallic patches has a mirror geometry about the first axis, wherein the first feed port is connected by a first feed port terminal to a first patch of the first pair of metallic patches at the first edge, wherein the first patch of the first pair of metallic patches is located near the third edge, wherein the first feed port is connected by a second feed port terminal to the dielectric circuit board, a second pair of parallel metallic patches located on the bottom side, wherein the second pair of parallel metallic patches extends for a second length from the third edge towards the fourth edge, wherein the second pair of parallel metallic patches has mirror geometry about the second axis, wherein the second feed port is connected by a first feed port terminal to a first patch of the second pair of metallic patches at the third edge, wherein the first patch of the second pair of metallic patches is located between the first patch of the first pair of metallic patches and the second central axis, wherein the second feed port is connected by a second feed port terminal to the dielectric circuit board, and a third pair of parallel metallic patches located on the bottom side, wherein the third pair of parallel metallic patches extends from the second edge towards the central axis, wherein the third pair of parallel metallic patches have a mirror geometry about the first axis, resonating, by the input signal, the shared aperture multi-band antenna in a dual band frequency range comprising a first resonance band in a range of 0.4 GHz to 0.6 GHz and a second resonance band in a range of 4.7 GHz to 5.8 GHz.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
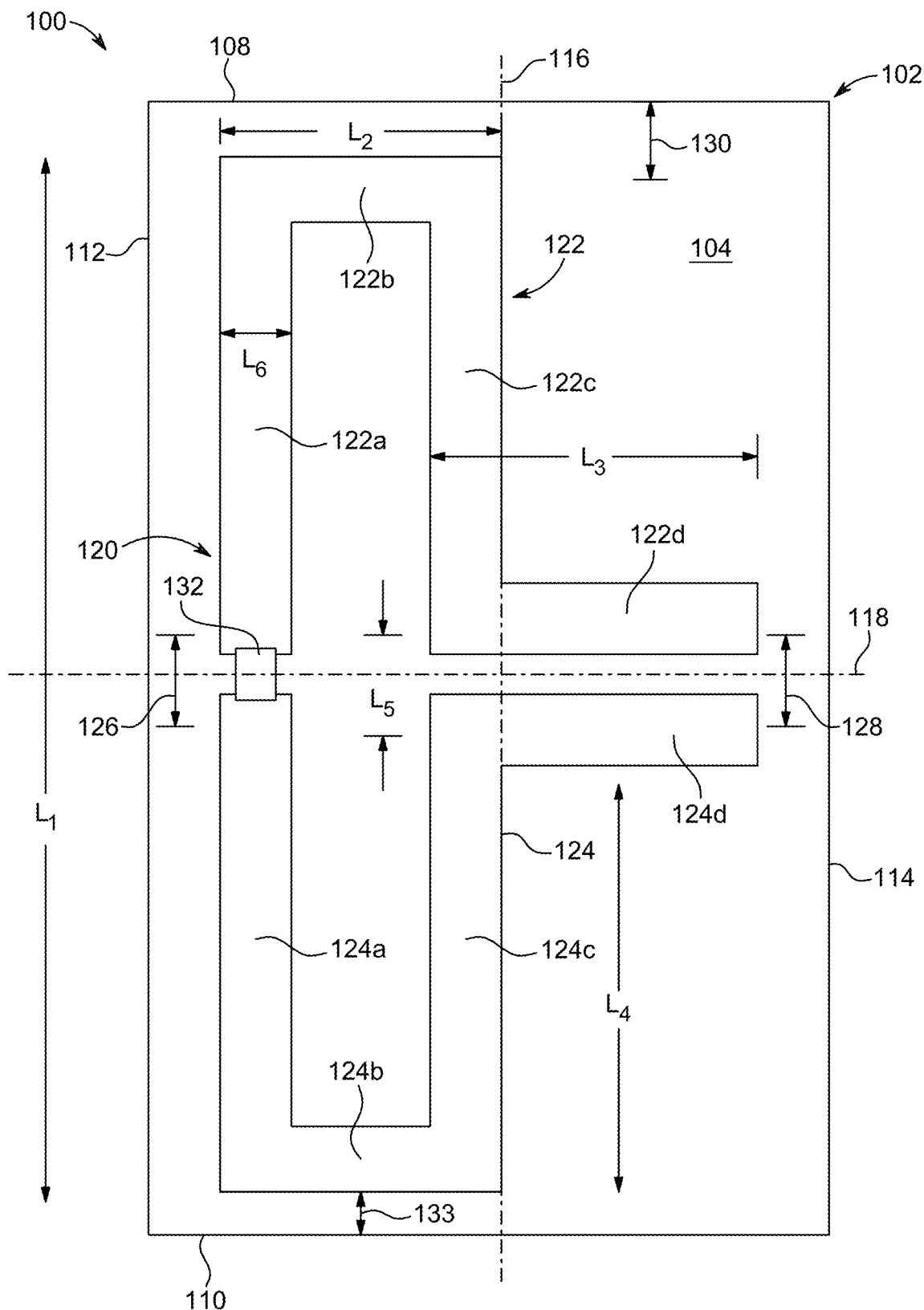
FIG. 1A is a top view of a shared aperture multi-band antenna, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a simple and miniaturized shared aperture multi-band antenna that utilizes the same radiating structure suitable for covering sub-1 GHz and sub-6 GHz frequency bands. A lumped element is used in the shared aperture multi-band antenna to achieve resonance at sub-1 GHz band with a very small aperture size. For example, the shared aperture multi-band antenna has a dielectric circuit board of 16.40 mm×10.50 mm×1.52 mm. In some embodiments the dimensions along any axis may be ±2 mm, ±1 mm, ±0.5 mm, ±0.1 mm, ±0.05 mm, or ±0.01 mm of the aforementioned values. A top side of the dielectric circuit board includes a folded dipole antenna, which is configured to be excited through a horizontal pair of parallel strips and a vertical pair of parallel strips located on a bottom side of the dielectric circuit board. The horizontal pair of parallel strips achieve dual-band characteristics at 434 MHz and 4.8 GHz, while the vertical pair of parallel strips produces resonance at 5.7 GHZ. The shared aperture antenna covers frequency bands of 0.431-0.435 GHz, 4.75-4.96 GHZ, and 5.6-5.88 GHz.

In various aspects of the disclosure, definitions of one or more terms that will be used in the document are provided below.

The term "decibel (or dB)" is a unit used to measure the ratio of input to output power. dB measures the intensity of the power level of an electrical signal by comparing it to a given scale. For example, an amplifier causes a gain in power measured in decibels and it is indicated by a positive number. In another example, cables can cause a loss of power. This is measured in negative dB.

Figure 1B:
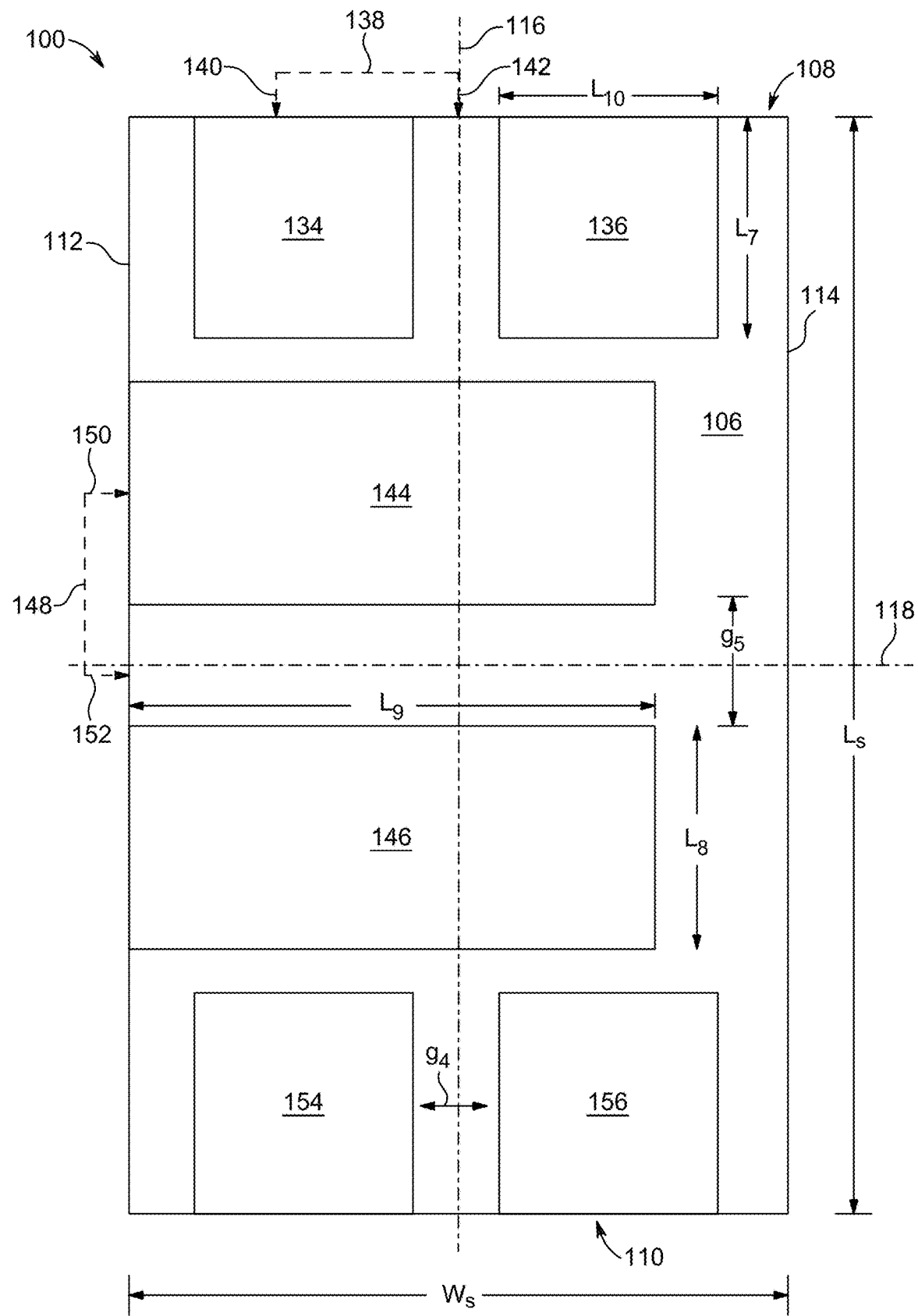
FIG. 1B is a bottom view of the shared aperture multi-band antenna, according to certain embodiments.

FIG. 1A-FIG. 1B illustrate an overall configuration of a shared aperture multi-band antenna.

FIG. 1A is a top view (front side) of the shared aperture multi-band antenna 100, (hereinafter interchangeably referred to as "the antenna 100"), according to one or more aspects of the present disclosure. FIG. 1B is a bottom view (back side) of the antenna 100, according to certain embodiments. In the drawings of FIG. 1A-FIG. 1B, the dimensions shown are for the example of a 16.40×10.50 mm$^2$ substrate (dielectric circuit board) and should not be construed as limiting. For a circuit board less than or larger than 16.40× 10.50 mm$^2$, the dimensions are proportionately smaller or bigger.

As shown in FIG. 1A and FIG. 1B, the antenna 100 includes a dielectric circuit board 102, a folded dipole microstrip antenna 120, a first gap 126, a second gap 128, a lumped inductor 132, a first pair of parallel metallic patches (134, 136), a first feed port 138, a second pair of parallel metallic patches (144, 146), a second feed port 148, and a third pair of parallel metallic patches (154, 156).

The dielectric circuit board 102 has a top side 104, a bottom side 106, a first edge 108, a second edge 110, a third edge 112, and a fourth edge 114. The first edge 108 is parallel to the second edge 110. The third edge 112 is perpendicular to the first edge 108 and the second edge 110. The third edge 112 is parallel to the fourth edge 114. A first central axis 116 extends from the first edge 108 to the second edge 110, and a second central axis 118 extends from the third edge 112 to the fourth edge 114. In an example, the dielectric circuit board 102 is a flame retardant (FR)-4 lossy dielectric plate with a dielectric constant (ε) of 4.3 and a loss tangent of 0.025. FR-4 (or FR4) is a glass-reinforced epoxy laminate material. FR-4 is a composite material composed of woven fiberglass cloth with an epoxy resin binder that is flame resistant (self-extinguishing). In an example, a thin layer of copper foil is typically laminated to one or both sides of the FR-4 lossy dielectric plate. The dielectric circuit board 102 preferably has a surface dimension of 15 mm to 30 mm in length and 10 mm to 20 mm in width. In an example, the dielectric circuit board 102 has dimensions of about 16.40 mm from the first edge 108 to the second edge 110 along the first central axis 116. In an example, the dielectric circuit board 102 has dimensions of about 10.50 mm from the third edge 112 to the fourth edge 114 along the second central axis 118. In an example, the dielectric circuit board 102 has dimensions of about 1.52 mm in a depth direction from the top side 104 to the bottom side 106. The dielectric circuit board should have dimensions no larger than 5 mm than the dimensions of the shared aperture antenna. Preferably, the dielectric circuit board is 2 mm larger in length and width than the shared aperture antenna. The extra one millimeter may be used as a mounting edge when installing the shared aperture antenna into a device, and provides structural stability to the very fine lines of the microstrips.

The folded dipole microstrip antenna 120 is formed on the top side 104 of the dielectric circuit board 102. The folded dipole microstrip antenna 120 includes two meander paths 122, 124. Each of the meander paths 122, 124 has a mirror geometry about the second central axis 118. The two meander paths 122, 124 enclose a shared aperture therebetween. The first gap 126 is located between the two meander paths 122, 124 near the third edge 112. The second gap 128 is located between the two meander paths 122, 124 near the fourth edge 114. In an aspect, the first gap 126 is about 0.6 mm, and the second gap 128 is about 0.6 mm. The lumped inductor 132 is inserted between the meander paths 122, 124 across the first gap 126 near the third edge 112. For example, an inductance value of the lumped inductor 132 is selected from a range of 50 nH to 200 nH. In an aspect, the lumped inductor 132 is a surface mount device inductor (SMD).

As shown in FIG. 1A, in a structural aspect, the first meander path 122 includes a first leg 122a, a second leg 122b, a third leg 122c, and an arm 122d. In an aspect, a width of the microstrip is about 1.20 mm. The first leg 122a is parallel to the third edge 112. The first leg 122a extends from the first gap 126 towards the first edge 108. In an aspect, a length of the first leg 122a is about 7.3 mm. The second leg 122b is perpendicular to the first leg 122a and parallel to the first edge 108. The second leg 122b is spaced from the first edge 108 by a third gap 130. In an aspect, a length of the second leg 122b is about 3.60 mm. In an aspect, the third gap 130 is about 1.00 mm. The third leg 122c is perpendicular to the second leg 122b and parallel to the first leg 122a. The third leg 122c extends to the second gap 128. In an aspect, a length of the third leg 122c is about 7.3 mm. The arm 122d is perpendicular to the third leg 122c. The arm 122d extends from the third leg 122c toward the fourth edge 114. In an aspect, a length of the arm 122d is selected from a range of about 2 mm to about 5 mm. In an example, the length of the arm 122d is about 5 mm.

In a structural aspect, the second meander path 124 includes a first leg 124a, a second leg 124b, a third leg 124c, and an arm 124d. The first leg 124a is parallel to the third edge 112. The first leg 124a extends from the first gap 126 towards the second edge 110. In an aspect, a length of the first leg 124a is about 7.3 mm. The second leg 124b is perpendicular to the first leg 124a and is parallel to the second edge 110. The second leg 124b is spaced from the second edge 110 by a third gap 133. In an aspect, a length of the second leg 124b is about 3.60 mm. The third leg 124c is perpendicular to the second leg 124b and is parallel to the first leg 124a. The third leg 124c extends towards the second gap 128. In an aspect, a length of the third leg 124c is about 7.3 mm. The arm 124d is perpendicular to the third leg 124c. In an example, the length of the arm 124d is about 5 mm.

As shown in FIG. 1B, the first pair of parallel metallic patches (134, 136) is located on the bottom side 106 of the dielectric circuit board 102. The first pair of parallel metallic patches (134, 136) includes a first patch 134 and a second patch 136. The first pair of parallel metallic patches (134, 136) extends for a length $L_7$ from the first edge 108 towards the second central axis 118. The first pair of parallel metallic patches (134, 136) has a mirror geometry about the first central axis 116.

The first feed port 138 includes two terminals: a first feed port terminal 140 and a second feed port terminal 142. The first feed port 138 is connected to the first patch 134 of the first pair of metallic patches (134, 136) at the first edge 108 by the first feed port terminal 140. The first patch 134 of the first pair of metallic patches (134, 136) is located near the third edge 112. The first feed port 138 is connected to the dielectric circuit board 102 by the second feed port terminal 142.

The second pair of parallel metallic patches (144, 146) is located on the bottom side 106 of the dielectric circuit board 102. The second pair of parallel metallic patches (144, 146) includes a first patch 144 and a second patch 146. The second pair of parallel metallic patches (144, 146) extends for a second length Ly from the third edge 112 towards the fourth edge 114. In an example, the second length $L_9$ of the second pair of metallic patches (144, 146) is selected from a range of about 1.5 mm to about 7.55 mm. The second pair of parallel metallic patches (144, 146) has a mirror geometry about the second central axis 118.

The second feed port 148 includes two terminals: a first feed port terminal 150, and a second feed port terminal 152. The second feed port 148 is connected to the first patch 144 of the second pair of metallic patches (144, 146) at the third edge 112 by the first feed port terminal 150. The first patch 144 of the second pair of metallic patches (144, 146) is located between the first patch 134 of the first pair of metallic patches (134, 136) and the second central axis 118. The second feed port 148 is connected to the dielectric circuit board 102 by the second feed port terminal 152. In an aspect, an input impedance at each feed port (first feed port 138, second feed port 148) is about 50 ohms. In an example, each feed port (first feed port 138, second feed port 148) is a SMA (SubMiniature version A) connector. The SMA connector is a semi-precision coaxial RF connector developed as a minimal connector interface for coaxial cable with a screw-type coupling mechanism. The SMA connector has a 50Ω impedance.

In an operational aspect, an input signal is connected to the first feed port 138 and the second feed port 148.

The third pair of parallel metallic patches (154, 156) is also located on the bottom side 106 of the dielectric circuit board 102. The third pair of parallel metallic patches (154, 156) includes a first patch 154 and a second patch 156. The third pair of parallel metallic patches (154, 156) extends from the second edge 110 towards the second central axis 118. The third pair of parallel metallic patches (154, 156) has a mirror geometry about the first central axis 116.

In an aspect, a width of each metallic patch of the first pair of metallic patches (134, 136) and the third pair of metallic patches (154, 156) is selected from a range of about 2 mm to about 5 mm.

The antenna 100 is configured to resonate in a dual band frequency range. In an example, the dual band frequency range includes a first resonance band (sub-1) in a range of 0.4 GHz to 0.6 GHz and a second resonance band (sub-6) in a range of 4.7 GHz to 5.8 GHz. The antenna 100 resonates in the dual band frequency range upon application of the input signal at both the first feed port 138 and the second feed port 148, respectively. In an aspect, the antenna 100 is configured to resonate at a frequency of about 5.8 GHz upon application of the input signal at only the first feed port 138. In an example, the antenna 100 is configured to resonate at frequencies of about 434 MHz and 4.8 GHz upon application of the input signal at only the second feed port 148.

The following experiments were conducted on the antenna 100:

During experimentation, the antenna 100 was stimulated using a CST Microwave Studio (a computational electromagnetics tool). The electromagnetic (EM) Performance of the disclosed antenna 100 is validated by simulation using the CST Microwave Studio. The antenna 100 is a means of transmitting energy (in the EM form) and information to a distant point in space. The antenna performance is characterized by the efficiency of transmission and the signal distortion. The CST Microwave Studio (manufactured by Dassault Systemes Simulia Corp, located at 5181 Natorp Blvd Ste 205 Mason, OH, 45040-7987, United States) is used to design, analyze, and define the dimensions of the geometry of the antenna 100.

The antenna 100's defined parameters were achieved by experimenting with varying size of the components. In an example, the antenna 100 is configured to have various defined antenna parameters, and their values are listed in table 1.

TABLE 1

Defined parameters of the antenna 100

| Parameter | Value (mm) | Parameter | Value (mm) |
|---|---|---|---|
| $L_s$ (length of the dielectric circuit board 102) | 16.40 | $W_s$ (width of the dielectric circuit board 102) | 10.50 |
| $L_1$ (length of the folded dipole microstrip antenna 120) | 15.20 | First gap 126 | 0.60 |
| $L_2$ (length of the first leg) | 3.60 | Second gap 128 | 0.60 |
| $L_3$ (length of the arm) | 6.70 | Third gap 130, 133 | 1.00 |
| $L_4$ (length of the third leg) | 5.60 | $g_4$ (gap between the first patch 154 and the second patch 156 of the third pair of parallel metallic patches (154, 156)) | 0.60 |
| $L_5$ (gap between the first meander path and the second meander path) | 1.50 | $g_5$ (gap between the first patch 144 and the second patch 146 of the second pair of parallel metallic patches (144, 146)) | 1.20 |
| $L_6$ (width of the microstrip) | 1.20 | $L_9$ (length of each patch of the second pair of parallel metallic patches (144, 146)) | 7.55 |
| $L_7$ (length of each patch of the first pair of parallel metallic patches (134, 136)) | 4.40 | $L_{10}$ (width of each patch of the first pair of parallel metallic patches (134, 136)) | 3.80 |
| $L_8$ (width of each patch of the second pair of parallel metallic patches (144, 146)) | 2.80 | $h_s$ (height of the dielectric circuit board 102) | 1.52 |

During experimentation, a parametric sweep was applied to several antenna parameters (for example, size of the folded dipole microstrip antenna and the metallic patches, shape of the folded dipole microstrip antenna and the metallic patches, orientation of the folded dipole microstrip antenna and the metallic patches) to achieve the required defined antenna that can be employed in biomedical and 5G communication bands. The parametric sweep was applied to observe how the results change when these parameters of the antenna change, and a parameterized design was achieved. The parameter sweep of the antenna 100 was performed to reveal how to define the dimensions of the components to achieve better performance.

Several antenna parameters including the length of folded dipole arm ($L_3$) (arm 122d), back strip length and width ($L_9$ and $L_{10}$), respectively along with the inductance ($L_{ind}$) are varied and their corresponding reflection coefficient curves were obtained. These curves were analyzed to achieve the required defined dimensions of the antenna 100.

First Experiment: Variations in the Length ($L_3$) of the Arm 122d of the First Meander Path 122

During the first experiment, the length ($L_3$) of the arm 122d was varied. It was observed that a change in the length ($L_3$) of the arm 122d causes the increase or decrease in the electrically length of the folded dipole microstrip antenna 120, resulting in frequency shifting, as shown in FIG. 2A-FIG. 2B.

Figure 2A:
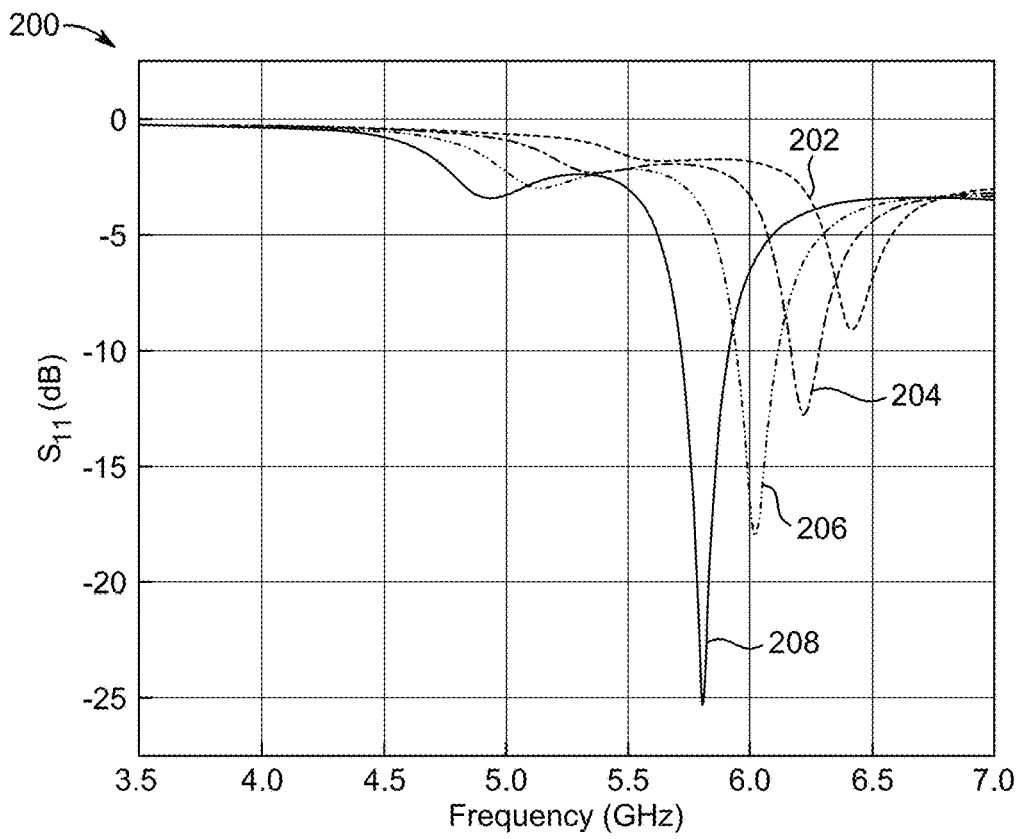
FIG. 2A is a graph of simulated reflection coefficient curves of the s-parameters ($S_{11}$) versus frequency for variations in the arm length ($L_3$), according to certain embodiments.

FIG. 2A is a graph 200 of the simulated reflection coefficient curves having s-parameters ($S_{11}$) for variations in the arm length ($L_3$). The S-parameters describe the input-output relationship between ports (or terminals) in an electrical system. $S_{11}$ represents a power that is reflected from the antenna, and hence is known as the reflection coefficient. If $S_{11}$=0 dB, then all the power is reflected from the antenna, and nothing is radiated. Signal 202 represents the simulated values of the $S_{11}$ when the arm length ($L_3$) is 2 mm. Further, signal 204 represents the simulated values of $S_{11}$ when the arm length ($L_3$) is 3 mm. Signal 206 represents the simulated values of $S_{11}$ when the arm length ($L_3$) is 4 mm. Signal 208 represents the simulated values of $S_{11}$ when the arm length ($L_3$) is 5 mm. FIG. 2A represents the reflection coefficient curve when the input signal was applied at only the first feed port 138, connected to the first pair of metallic patches (134, 146) at the first edge 108. Resonance can be seen at 5.7 GHZ to 6.4 GHz with variations in arm length from 2 mm to 5 mm.

Figure 2B:
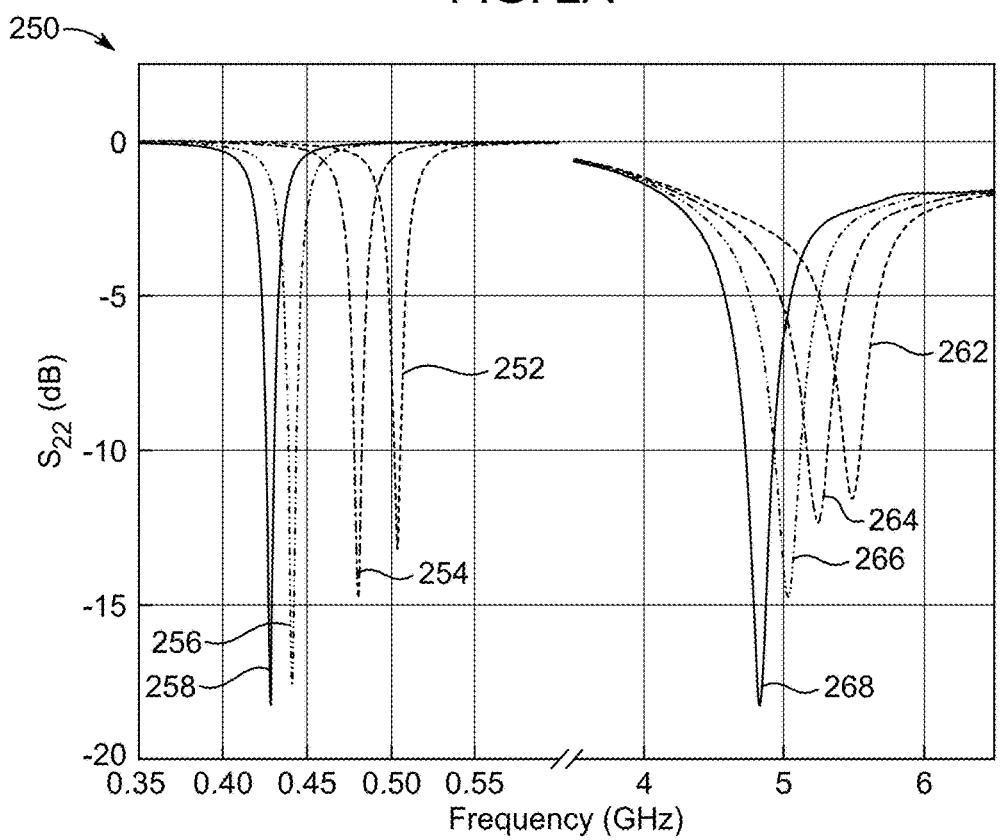
FIG. 2B is a graph of simulated reflection coefficient curves of s-parameters ($S_{22}$) versus frequency for variations in the arm length ($L_3$), according to certain embodiments.

FIG. 2B is a graph 250 of the measured reflection coefficient curves having s-parameters ($S_{22}$) for variations in the arm length ($L_3$). Applying the input signal at the second feed port 148, connected to the second pair of metallic patches at the third edge 112, results in a dual band resonance at sub-1 GHz along with sub-6 GHz, as shown in FIG. 2B. FIG. 2B illustrates the curves where resonance at sub-1 GHz (0.4 GHz to 0.6 GHZ) is achieved along with 4.7 GHz to 5.6 GHz at higher bands (sub-6 GHz) with variation in arm length from 2 mm to 5 mm. In the sub-1 GHz (0.4 GHz to 0.6 GHz), signal 252 represents the simulated values of the $S_{22}$ when the arm length ($L_3$) is 2 mm. Further, signal 254 represents the simulated values of $S_{22}$ when the arm length ($L_3$) is 3 mm. Signal 256 represents the simulated values of $S_{22}$ when the arm length ($L_3$) is 4 mm. Signal 258 represents the simulated values of $S_{22}$ when the arm length ($L_3$) is 5 mm. In the sub band (4.7 to 5.6 GHZ), signal 262 represents the simulated values of the $S_{22}$ when the arm length ($L_3$) is 2 mm. Further, signal 264 represents the simulated values of $S_{22}$ when the arm length ($L_3$) is 3 mm. Signal 266 represents the simulated values of $S_{22}$ when the arm length ($L_3$) is 4 mm. Signal 268 represents the simulated values of $S_{22}$ when the arm length ($L_3$) is 5 mm.

Second Experiment: Variations in the Inductance ($L_{ind}$) of the Lumped Inductor 132

During the second experiment, the inductance ($L_{ind}$) of the lumped inductor 132 was changed. Initially, no lumped inductor was added to the design of the antenna 100. The antenna 100 includes the FR-4 dielectric circuit board 102 containing the folded dipole microstrip antenna 120 at the top side (top layer) 104 and two parallel strips at the bottom side 106. With the addition of the lumped inductor 132, the resonance frequency of the antenna 100 shifts to sub-1 GHz. Further, increasing the value of the inductance of the lumped inductor 132 shifted the resonance curve below the target frequency. Also, defined parameters of the antenna 100, as shown in table 1, resulted in resonance at sub-1 GHZ (this is one of three bands at which the antenna produces resonance).

Figure 3A:
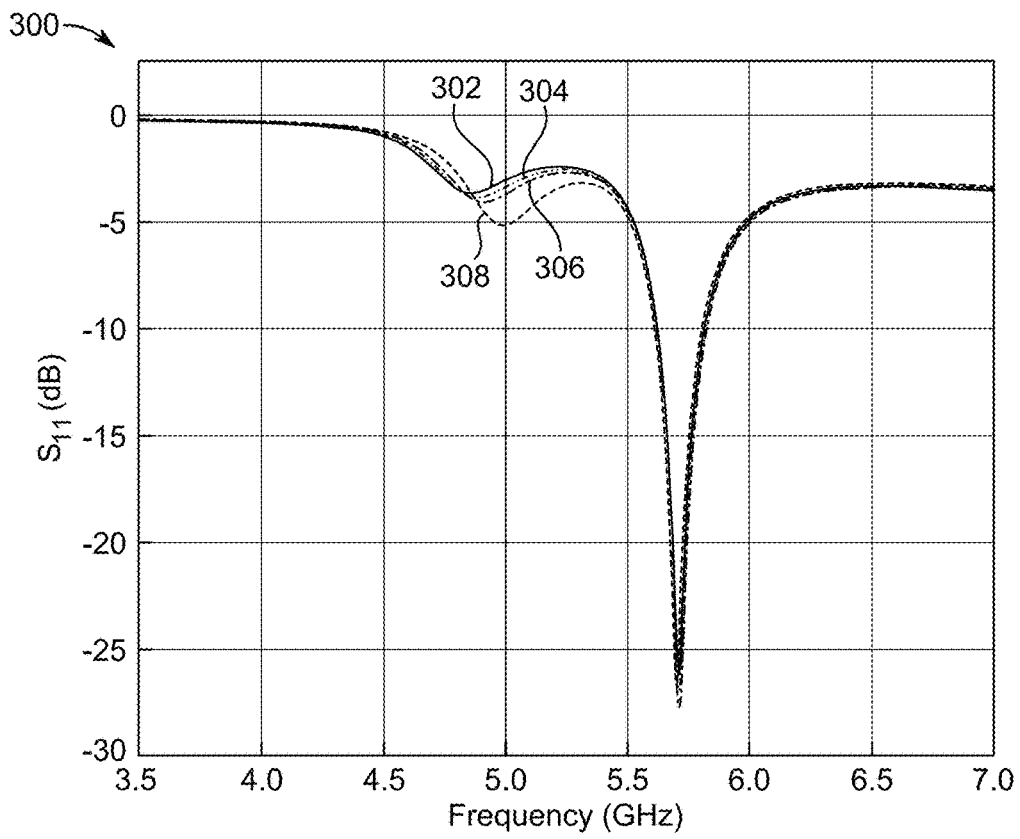
FIG. 3A is a graph of a simulated reflection coefficient curves of s-parameters ($S_{11}$) versus frequency for variations in inductance ($L_{ind}$), according to certain embodiments.

FIG. 3A is a graph 300 of the simulated reflection coefficient curves having s-parameters ($S_{11}$) for variations in the inductance ($L_{ind}$) of the lumped inductor 132. Reflection coefficient curves shown in FIG. 3A depicts the variations in values of the lumped inductor 132 from 50 nH-200 nH. As shown in FIG. 3A, increasing the value of the lumped inductor 132 results in shifting to lower frequency band. Signal 302 represents the simulated values of $S_{11}$ when the inductance ($L_{ind}$) is 200 nH. Further, signal 304 represents the simulated values of $S_{11}$ when the inductance ($L_{ind}$) is 150 nH. Signal 306 represents the simulated values of $S_{11}$ when the inductance ($L_{ind}$) is 100 nH. Signal 308 represents the simulated values of $S_{11}$ when the inductance ($L_{ind}$) is 50 nH.

Figure 3B:
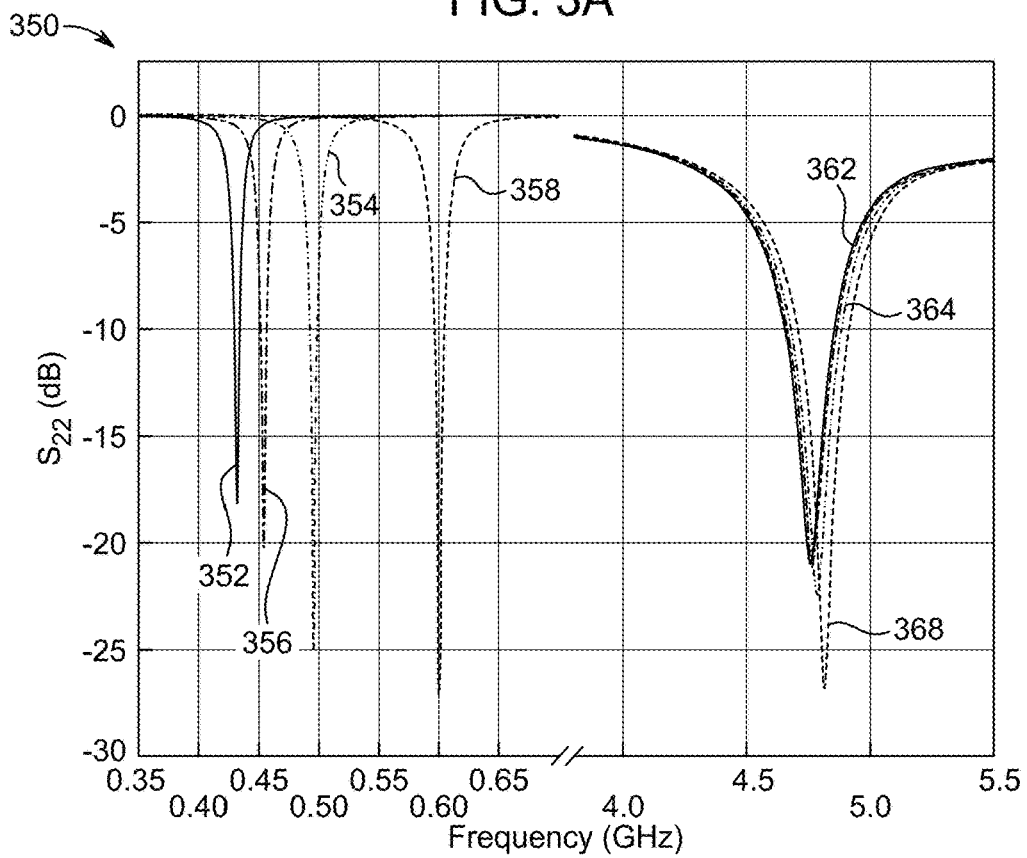
FIG. 3B is a graph of a simulated reflection coefficient curves versus frequency having s-parameters ($S_{22}$) for variations in inductance ($L_{ind}$), according to certain embodiments.

FIG. 3B is a graph 350 representing an effect on the measured reflection coefficient curves having s-parameters ($S_{22}$) for variations in inductance ($L_{ind}$). Applying the input signal at the second feed port 148, results in shifting to lower frequency band, where dual frequency resonance was achieved, as shown in FIG. 3B. In the sub-1 GHz (0.35 GHz to 0.7 GHZ), signal 352 represents the simulated values of $S_{22}$ when the inductance ($L_{ind}$) is 200 nH. Further, signal 354 represents the simulated values of $S_{22}$ when the inductance ($L_{ind}$) is 150 nH. Signal 356 represents the simulated values of $S_{22}$ when the inductance ($L_{ind}$) is 180 nH. Signal 358 represents the simulated values of $S_{22}$ when the inductance ($L_{ind}$) is 100 nH. In the sub band (3.7 to 5.6 GHZ), signal 362 represents the simulated values of the s-parameters ($S_{22}$) when the inductance ($L_{ind}$) is 200 nH. Further, signal 364 represents the simulated values of $S_{22}$ when the inductance ($L_{ind}$) is 150 nH. Signal 368 represents the simulated values of $S_{22}$ when the inductance ($L_{ind}$) is 100 nH.

Third Experiment: Variations in the Length ($L_9$) of the Second Pair of Metallic Patches (Also Known as Back Strip Length ($L_9$))

Figure 4A:
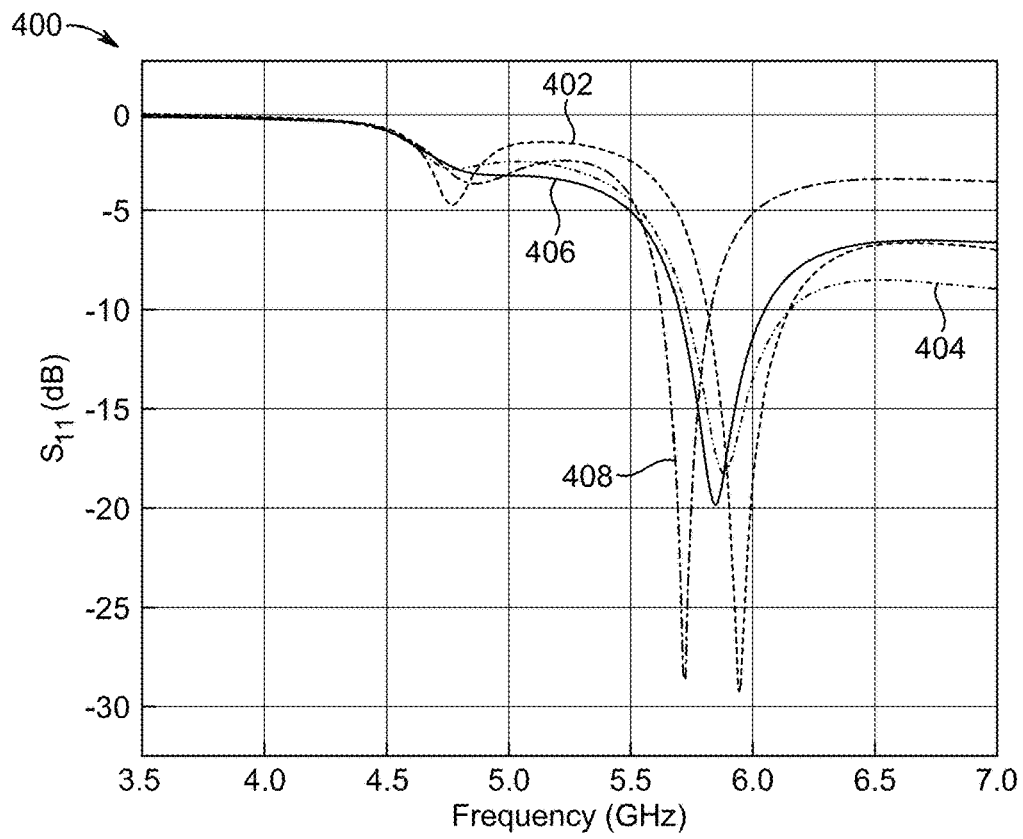
FIG. 4A is a graph representing an effect of applying parametric sweep on the simulated reflection coefficient curves having s-parameters ($S_{11}$) for variations in the back strip length ($L_9$), according to certain embodiments.

During the third experiment, the length ($L_9$) of the second pair of metallic patches was changed. FIG. 4A is a graph 400 representing an effect of applying parametric sweep on the simulated reflection coefficient curves having s-parameters ($S_{11}$) for variations in the back strip length ($L_9$). Applying parametric sweep to the length ($L_9$) of the back strip from 1.5 mm to 7.5 mm (horizontal pair of parallel strips), caused a shifting of resonance curve to lower frequency as observed in FIG. 4A. Signal 402 represents the simulated values of the $S_{11}$ when the length ($L_9$) is 1.5 mm. Further, signal 404 represents the simulated values of $S_{11}$ when the length ($L_9$) is 3.5 mm. Signal 406 represents the simulated values of Sn when the length ($L_9$) is 5.5 mm. Signal 408 represents the simulated values of $S_{11}$ when the length ($L_9$) is 7.5 mm.

Figure 4B:
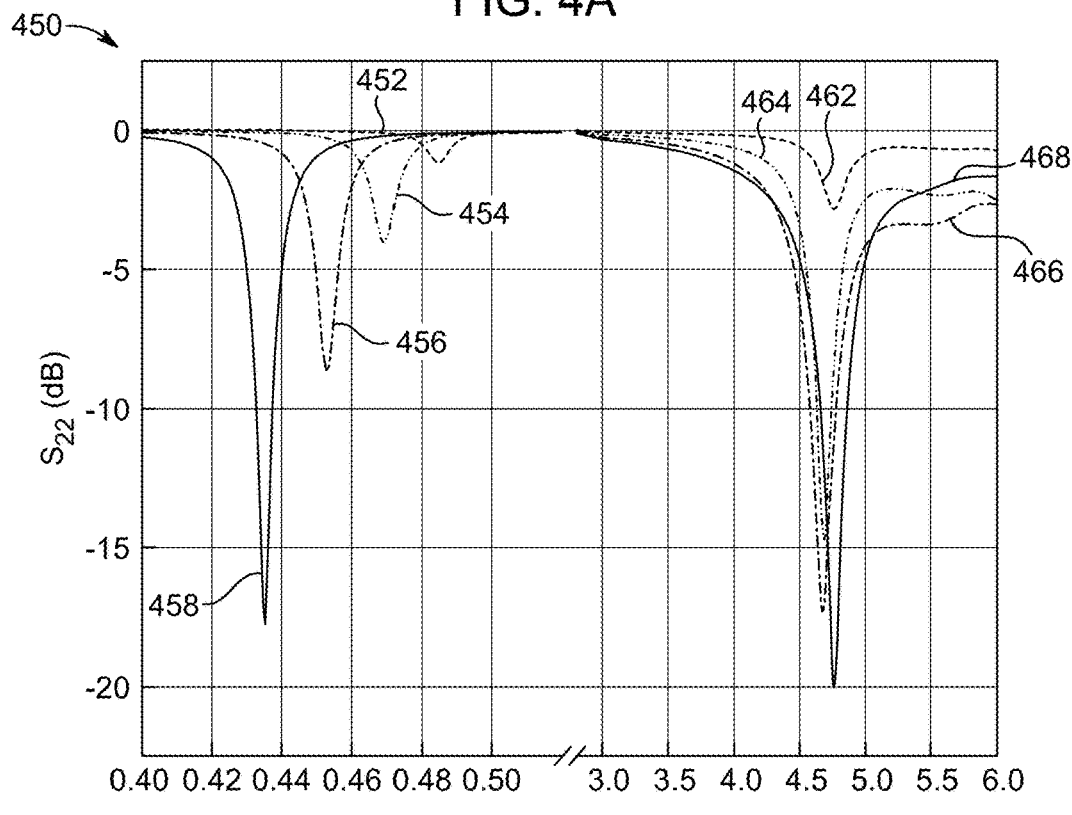
FIG. 4B is a graph representing an effect of applying parametric sweep on the simulated reflection coefficient curves having s-parameters ($S_{22}$) for variations in the back strip length ($L_9$), according to certain embodiments.

FIG. 4B is a graph 450 representing an effect of applying parametric sweep on the measured reflection coefficient curves having s-parameters ($S_{22}$) for variations in the back strip length ($L_9$). FIG. 4B shows the reflection coefficient $S_{22}$ where improved impedance matching along with shifting at lower frequency band was observed while change in back strip length ($L_9$) had minimum effect on frequency shift at 4.7 GHZ. However, improved impedance matching was achieved with higher value of the back strip length ($L_9$) as illustrated in the FIG. 4B. In the sub-1 GHz (0.4 GHz to 0.6 GHz), signal 452 represents the simulated values of the $S_{22}$ when the length ($L_9$) is 1.5 mm. Signal 454 represents the simulated values of $S_{22}$ when the length ($L_9$) is 3.5 mm. Signal 456 represents the simulated values of $S_{22}$ when the length ($L_9$) is 5.5 mm. Signal 458 represents the simulated values of $S_{22}$ when the length ($L_9$) is 7.5 mm. In the sub band (3 GHz to 6 GHz), signal 462 represents the simulated values of the $S_{22}$ when the length ($L_9$) is 1.5 mm. Signal 464 represents the simulated values of $S_{22}$ when the length ($L_9$) is 3.5 mm. Signal 466 represents the simulated values of $S_{22}$ when the length ($L_9$) is 5.5 mm. Signal 468 represents the simulated values of $S_{22}$ when the length ($L_9$) is 7.5 mm.

Fourth Experiment: Variations in the Length ($L_{10}$) of the First Pair of Metallic Patches (Also Known as Back Strip Length ($L_{10}$))

Figure 5A:
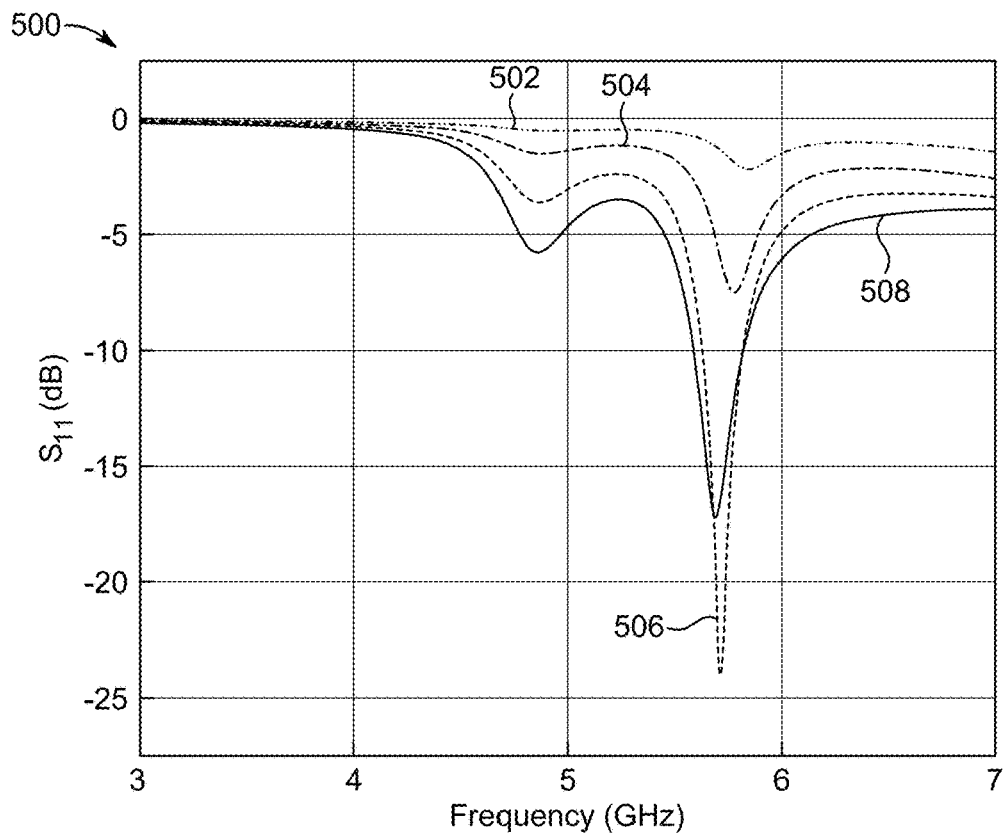
FIG. 5A is a graph of a simulated reflection coefficient curves having s-parameters ($S_{11}$) for variations in the back strip length ($L_{10}$), according to certain embodiments.

During the fourth experiment, the length ($L_{10}$) of the first pair of metallic patches (134, 136) was changed. FIG. 5A represents the reflection coefficient curve when the input signal was applied at only the first feed port 138, connected to the connected the first pair of metallic patches at the first edge 108. FIG. 5A is a graph 500 of the simulated reflection coefficient curves having s-parameters ($S_{11}$) for variations in the back strip length ($L_{10}$). Signal 502 represents the simulated values of the $S_{11}$ when the length ($L_{10}$) is 2 mm. Further, signal 504 represents the simulated values of $S_{11}$ when the length ($L_{10}$) is 3 mm. Signal 506 represents the simulated values of $S_{11}$ when the length ($L_{10}$) is 4 mm. Signal 508 represents the simulated values of $S_{11}$ when the length ($L_{10}$) is 5 mm.

Figure 5B:
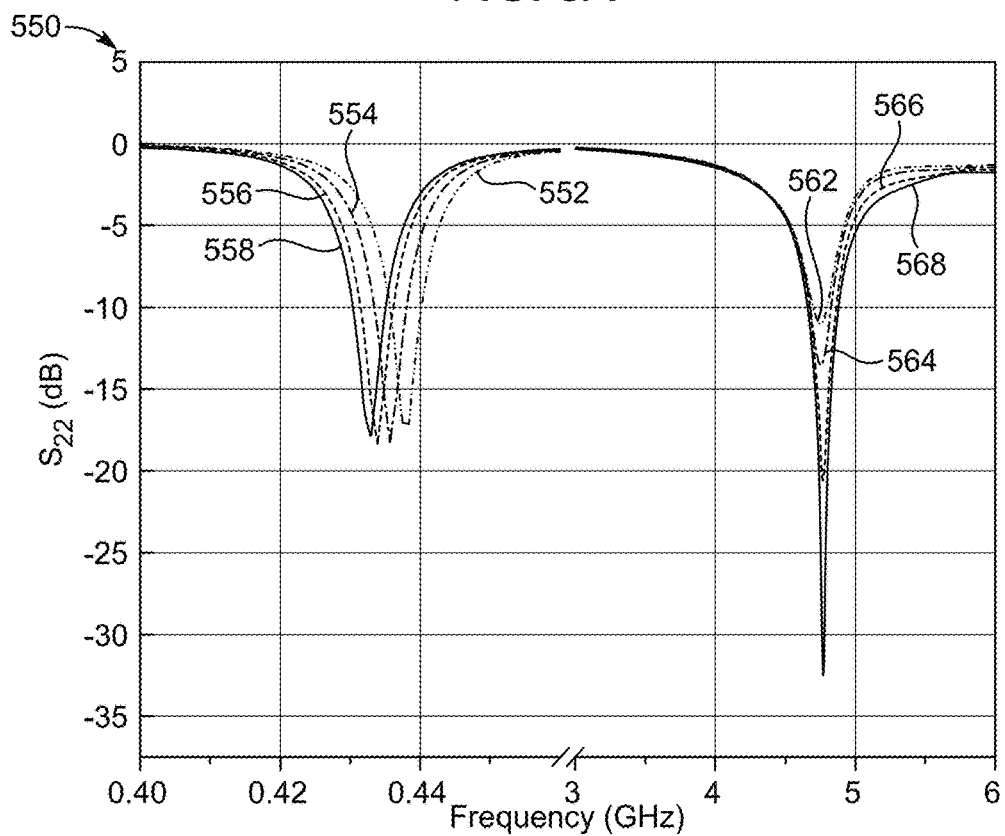
FIG. 5B is a graph representing an effect on the simulated reflection coefficient curves having s-parameters ($S_{22}$) for variations in the back strip length ($L_{10}$), according to certain embodiments.

FIG. 5B is a graph 550 of the simulated reflection coefficient curves having s-parameters ($S_{22}$) for variations in back strip length ($L_{10}$). FIG. 5B shows resonance at sub-1 GHz band where frequency shift from 0.439 GHz to 0.43 GHz is observed with change in length ($L_{10}$), while improved impedance at sub-6 GHz is achieved. In the sub-1 GHz (0.4 GHz to 0.6 GHZ), signal 552 represents the simulated values of $S_{22}$ when the length ($L_{10}$) is 2 mm. Signal 554 represents the simulated values of $S_{22}$ when the length ($L_{10}$) is 3 mm. Signal 556 represents the simulated values of $S_{22}$ when the length ($L_{10}$) is 4 mm. Signal 558 represents the simulated values of $S_{22}$ when the length ($L_{10}$) is 5 mm. In the sub band (3 GHz to 6 GHz), signal 562 represents the simulated values of $S_{22}$ when the length ($L_{10}$) is 2 mm. Signal 564 represents the simulated values of $S_{22}$ when the length ($L_{10}$) is 3 mm. Signal 566 represents the simulated values of $S_{22}$ when the length ($L_{10}$) is 4 mm. Signal 568 represents the simulated values of $S_{22}$ when the length ($L_{10}$) is 5 mm.

Figure 6A:
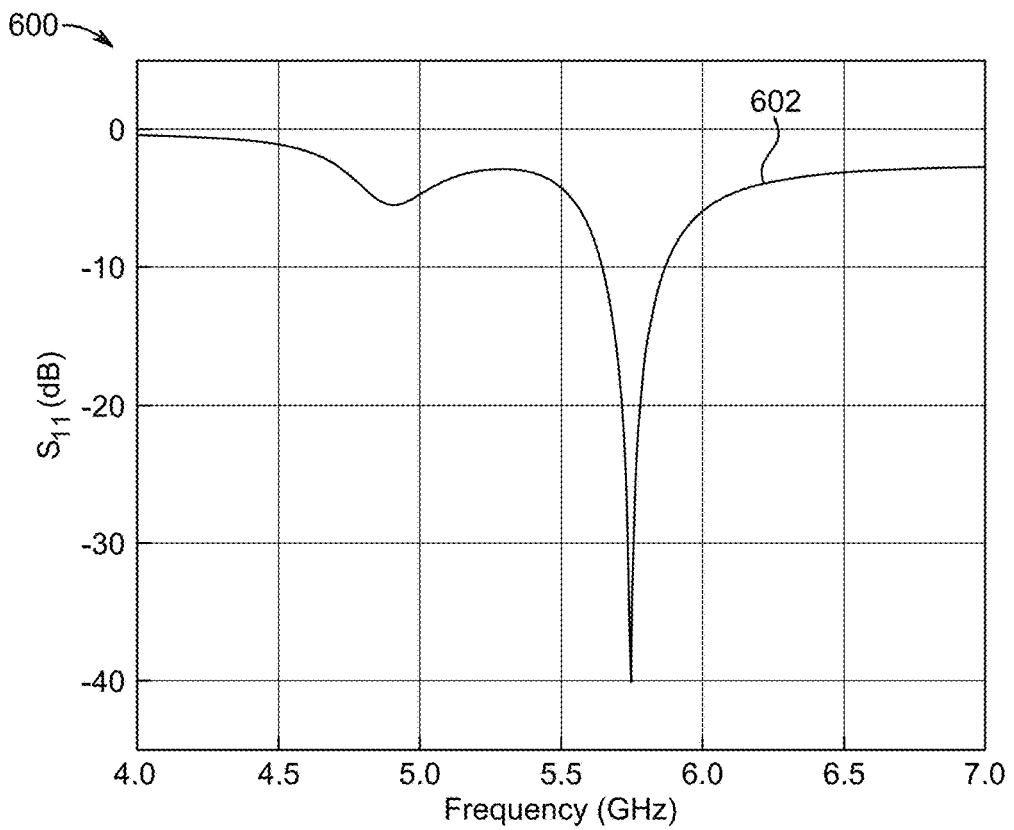
FIG. 6A is a graph of a simulated reflection coefficient curves having s-parameters ($S_{11}$) of the shared aperture multi-band antenna, according to certain embodiments.

The antenna 100 contains two feed ports (first feed port 138, and the second feed port 148). When the input signal was applied at only the second feed port 148, the antenna produced resonance at 5.8 GHz as shown in FIG. 6A. FIG. 6A is a graph 600 of the simulated reflection coefficient curves having s-parameters ($S_{11}$) of the antenna 100. Signal 602 represents the simulated values of $S_{11}$.

Figure 6B:
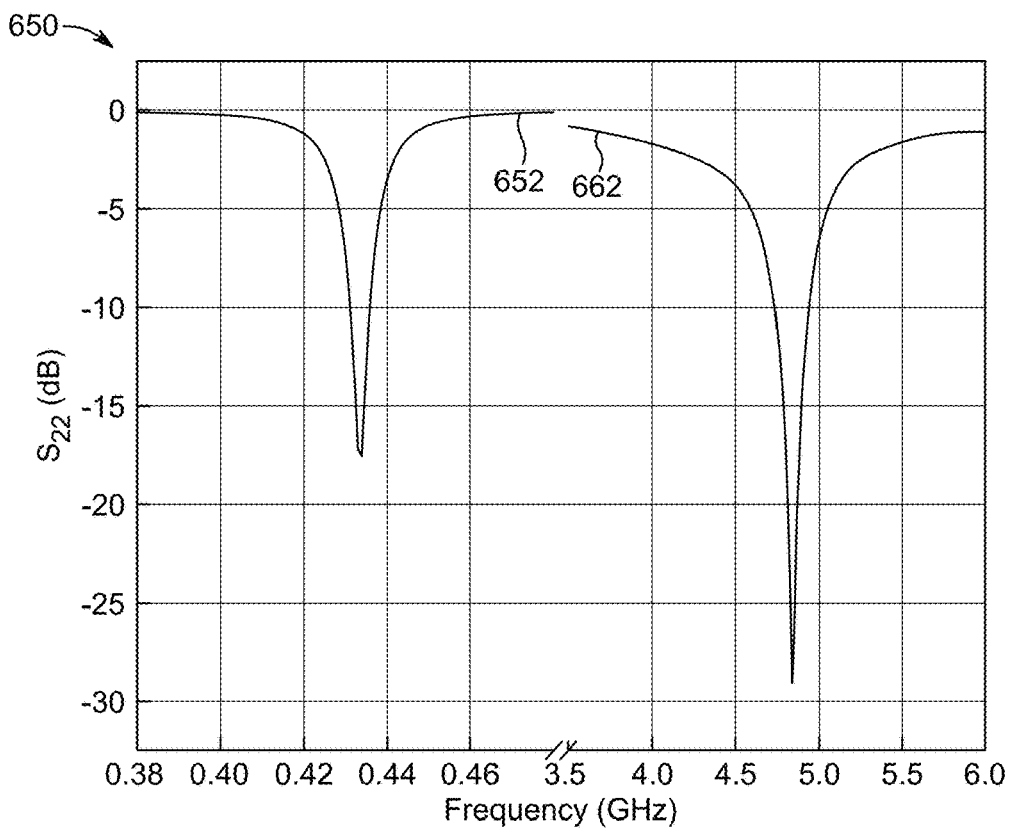
FIG. 6B is a graph of a simulated reflection coefficient curves having s-parameters ($S_{22}$) of the shared aperture multi-band antenna, according to certain embodiments.

When the input signal was applied at only the first feed port 138, the antenna 100 produced resonance at 434 MHz and 4.8 GHz as shown in FIG. 6B. FIG. 6B is a graph 650 of the simulated reflection coefficient curves having s-parameters ($S_{22}$) of the antenna 100. In the sub-1 GHz (0.38 to 0.6 GHz), signal 652 represents the simulated values of the s-parameters ($S_{22}$). In the sub band (3.5 to 6 GHZ), signal 662 represents the simulated values of the s-parameters ($S_{22}$).

Figure 7A:
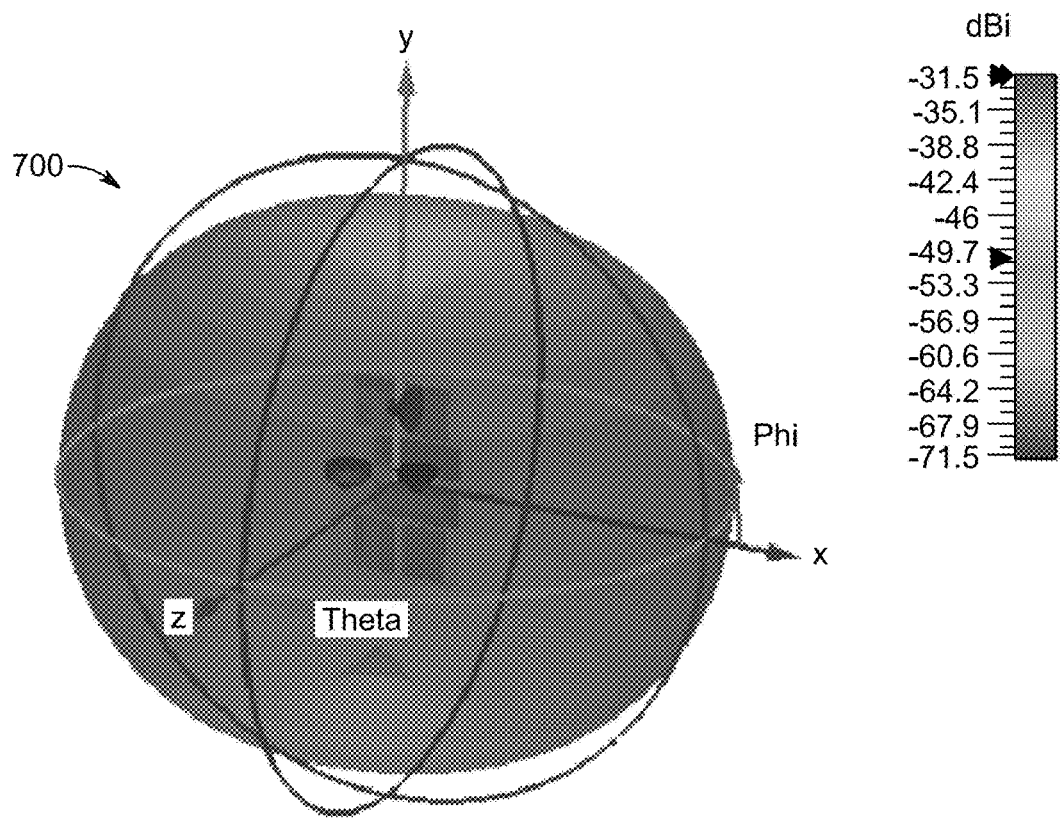
FIG. 7A is a three-dimensional (3-D) gain pattern of the shared aperture multi-band antenna at 434 MHz, according to certain embodiments.

FIG. 7A is a three-dimensional (3-D) gain pattern 700 of the antenna 100 at 434 MHz.

Figure 7B:
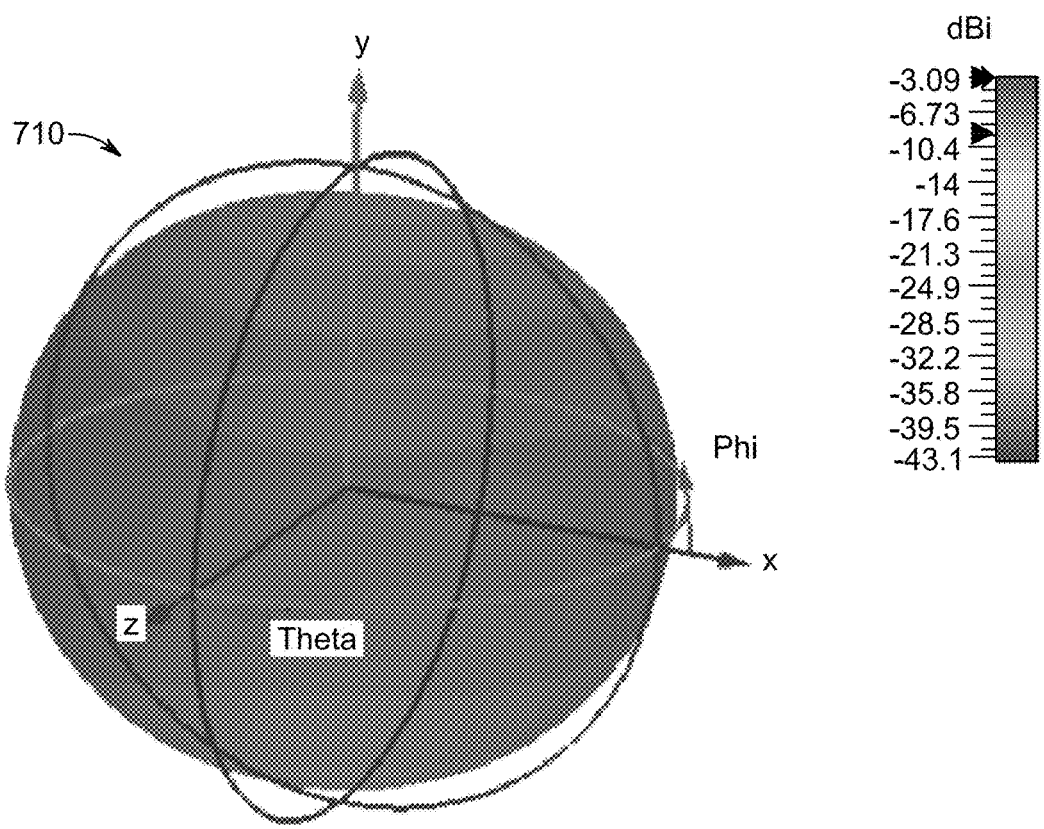
FIG. 7B is a 3-D gain pattern of the shared aperture multi-band antenna at 4.8 GHZ, according to certain embodiments.

FIG. 7B is a 3-D gain pattern 710 of the antenna 100 at 4.8 GHz.

Figure 7C:
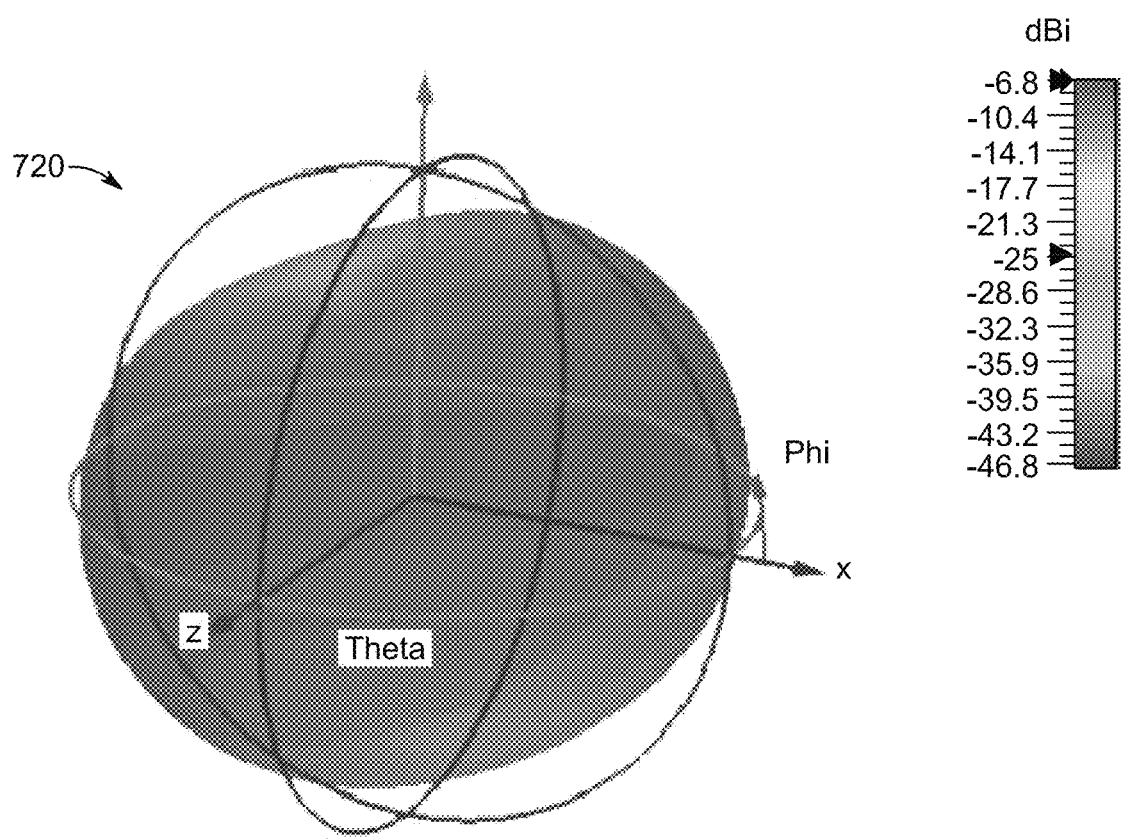
FIG. 7C is a 3-D gain pattern of the shared aperture multi-band antenna at 5.7 GHZ, according to certain embodiments.

FIG. 7C is a 3-D gain pattern 720 of the antenna 100 at 5.7 GHZ.

The antenna 100 has realized gain of −31 dBi, −3 dBi and −6.8 dBi at resonance frequencies of 434 MHz, 4.8 GHz and 5.7 GHZ, respectively as depicted in FIG. 7A, FIG. 7B, and FIG. 7AC. In an aspect, the bandwidth of 223 MHz has been achieved at 5.74 GHZ, 207 MHz at 4.84 GHz and 4.5 MHz at 434 MHz (sub-1 GHz), respectively in the antenna 100.

In an aspect, the antenna elements (the folded dipole microstrip antenna 120, the first pair of metallic patches (134, 136), the second pair of metallic patches (144, 146), and the third pair of parallel metallic patches (154, 156)) may be integrally laminated on the dielectric circuit board 102 by screen printing, roll coating, transfer, vapor deposition, or the like. In an aspect, the antenna 100 is fabricated using a printing method. For example, the folded dipole microstrip antenna 120 is printed on the top side of the dielectric circuit board 102. The first pair of metallic patches (134, 136), the second pair of metallic patches (144, 146), and the third pair of parallel metallic patches (154, 156)) are printed on the bottom side of the dielectric circuit board 102.

In an exemplary aspect of fabrication of the antenna 100, there are five main stages, namely, simulation of the antenna, antenna printing, antenna curing, conductivity measurement, and antenna parameters measurements.

1. The design and fabrication processes start with numerical simulation using the CST Microwave Studio.
2. Once simulations were performed, geometry of the antenna design was built using a printing method and a prototype structure was generated. The printing was carried out with different layers using conductive ink. In an aspect, a DMP-2800 dimatix fujifilm materials printer, a printrbot simple metal printer3D printer or a ROBO 3D printer were used during the fabrication of the antenna 100. During the printing method, defined fabrication conditions, such as the number of printed layers, curing time, and feed structure were considered.
3. In the antenna curing, the prototype structure underwent the curing process in a high-precision convection oven. The antenna curing improves or enhances the strength and durability of the materials used in the antenna printing.
4. Under conductivity measurement, for analyzing design parameters, an electrical conductivity of the antenna was measured.
5. In the last step, various antenna parameters such as, resonant frequency, $S_{11}$, gain, and far-field radiation patterns, were measured.

In an example, the antenna elements (the folded dipole microstrip antenna 120, the first pair of metallic patches (134, 136), the second pair of metallic patches (144, 146), and the third pair of parallel metallic patches (154, 156)) may be formed from copper, gold, brass, graphene, aluminum and/or any combination thereof.

The present disclosure describes a miniaturized electrically small, shared aperture multi-band antenna designed at sub-1 GHz (dual band) and sub-6 GHz bands using FR-4 lossy substrate material. The top side of the dielectric circuit board 102 contains the folded dipole patch (acting as folded dipole microstrip antenna 120), where the lumped inductor 132 is added to the path to shift the resonance of the antenna 100 at sub-1 GHz. The shared aperture includes two feeding ports (138, 148). Further, a parametric analysis was performed to achieve the reflection coefficient curves where good impedance matching of the antenna at sub-1 GHz was obtained.

In an aspect, the antenna 100, operating at sub-1 GHz band, is suitable for biomedical applications and at sub-6 GHz band suitable for 5G and IoT applications. The main features of the antenna 100 are listed below:

1. Miniaturized size.
2. Achieving resonance at sub-1 GHz and sub-6 GHz.
3. Employing a simplified planar structure that includes a single lumped inductor instead of multiple lumped inductors, as in a conventional antenna. The conventional antenna practices multiple lumped elements, for which the tuning of individual element (Inductor/capacitor) becomes challenging.
4. Achieving an impedance matching at 50Ω without using a Balun transformer despite the use of multiple coaxial feeds. The Balun transformer performs two functions i.e., impedance transformation and balanced to unbalanced transformation.

The first embodiment is illustrated with respect to FIG. 1A-FIG. 1B. The first embodiment describes a shared aperture multi-band antenna. The antenna includes a dielectric circuit board 102, a folded dipole microstrip antenna 120, a first pair of parallel metallic patches (134, 136), a first feed port 138, a second pair of parallel metallic patches (144, 146), a second feed port 148, and a third pair of parallel metallic patches (154, 156). The dielectric circuit board 102 includes a top side 104, a bottom side 106, a first edge 108, a second edge 110 parallel to the first edge 108, a third edge 112 perpendicular to the first edge 108 and the second edge 110, and a fourth edge 114 parallel to the third edge 112, a first central axis 116 which extends from the first edge 108 to the second edge 110, and a second central axis 118 which extends from the third edge 112 to the fourth edge 114. The folded dipole microstrip antenna 120 is formed on the top side 104. The folded dipole microstrip antenna 120 includes two meander paths. Each is mirror geometry about the second central axis 118. The two meander paths enclose a shared aperture therebetween. The first gap 126 is located between the two meander paths near the third edge 112. The second gap 128 located between the two meander paths near the fourth edge 114. A lumped inductor 132 is inserted across the first gap 126 near the third edge 112. The first pair of parallel metallic patches (134, 136) is located on the bottom side 106. The first pair of parallel metallic patches (134, 136) extends from the first edge 108 towards the second central axis 118. The first pair of parallel metallic patches (134, 136) has a mirror geometry about the first central axis. The first feed port 138 is connected by a first feed port terminal to a first patch of the first pair of metallic patches at the first edge 108. The first patch of the first pair of metallic patches is located near the third edge 112. The first feed port 138 is connected by a second feed port terminal to the dielectric circuit board. The second pair of parallel metallic patches (144, 146) located on the bottom side 106. The second pair of parallel metallic patches (144, 146) extends for a second length from the third edge 112 towards the fourth edge 114. The second pair of parallel metallic patches (144, 146) has mirror geometry about the second central axis. The second feed port 148 is connected by a first feed port terminal to a first patch of the second pair of metallic patches at the third edge 112. The first patch of the second pair of metallic patches is located between the first patch of the first pair of metallic patches and the second central axis 118. The second feed port 148 is connected by a second feed port terminal to the dielectric circuit board. The third pair of parallel metallic patches (154, 156) is located on the bottom side 106, wherein the third pair of parallel metallic patches (154, 156) extends from the second edge 110 towards the second central axis 118, wherein the third pair of parallel metallic patches (154, 156) have a mirror geometry about the first central axis. The shared aperture multi-band antenna is configured to resonate in a dual band frequency range comprising a first resonance band in a range of 0.4 GHz to 0.6 GHz and a second resonance band in a range of 4.7 GHz to 5.8 GHz upon application of an input signal at both the first feed port 138 and the second feed port 148.

In an aspect, the first meander path includes a first leg parallel to the third edge 112, wherein the first leg extends from the first gap 126 towards the first edge 108, a second leg perpendicular to the first leg and parallel to the first edge 108, wherein the second leg is spaced from the first edge 108 by a third gap, a third leg perpendicular to the second leg and parallel to the first leg, wherein the third leg extends to the second gap 128, and an arm perpendicular to the third leg, wherein the arm extends from the third leg toward the fourth edge 114.

In an aspect, a length of the arm is about 5 mm.

In an aspect, a length of the arm is selected from a range of about 2 mm to about 5 mm.

In an aspect, the first gap 126 is about 0.6 mm, the second gap 128 is about 0.6 mm and the third gap is about 1.00 mm.

In an aspect, a width of the microstrip is about 1.20 mm; a length of the first leg is about 7.3 mm; a length of the second leg is about 3.60 mm; a length of the third leg is about 7.3 mm; and a length of the arm is about 5.0 mm.

In an aspect, the second meander path includes a first leg parallel to the third edge 112, wherein the first leg extends from the first gap 126 towards the second edge 110; a second leg perpendicular to the first leg and parallel to the second edge 110, wherein the second leg is spaced from the second edge 110 by a third gap; a third leg perpendicular to the second leg and parallel to the first leg, wherein the third leg extends towards the second gap 128; and an arm perpendicular to the third leg.

In an aspect, the first gap 126 is about 0.6 mm, the second gap 128 is about 0.6 mm and the third gap is about 1.00 mm.

In an aspect, the dielectric circuit board 102 has dimensions of about 16.40 mm from the first edge 108 to the second edge 110 along the first central axis; about 10.50 mm from the third edge 112 to the fourth edge 114 along the second central axis; and about 1.52 mm in a depth direction from the top side 104 to the bottom side 106.

In an aspect, the second length of the second pair of metallic patches is selected from a range of about 1.5 mm to about 7.55 mm.

In an aspect, a width of each metallic patch of the first pair of metallic patches and the third pair of metallic patches is selected from a range of about 2 mm to about 5 mm.

In an aspect, an inductance value of the lumped inductor 132 is selected from a range of 50 nH to 200 nH.

In an aspect, the shared aperture multi-band antenna is configured to resonate at a frequency of about 5.8 GHz upon application of an input signal at only the first feed port 138.

In an aspect, the shared aperture multi-band antenna is configured to resonate at frequencies of about 434 MHz and 4.8 GHz upon application of an input signal at only the second feed port 148.

In an aspect, an input impedance at each feed port is about 50 ohms.

The second embodiment is illustrated with respect to FIG. 1A-FIG. 1B. The second embodiment describes a method for making a shared aperture multi-band antenna. The method includes obtaining a dielectric circuit board 102 including a top side 104, a bottom side 106, a first edge 108, a second edge 110 parallel to the first edge 108, a third edge 112 perpendicular to the first edge 108 and the second edge 110, and a fourth edge 114 parallel to the third edge 112, a first central axis 116 which extends from the first edge 108 to the second edge 110, and a second central axis 118 which extends from the third edge 112 to the fourth edge 114. The method includes printing, with metal, a folded dipole microstrip antenna 120 on the top side 104, wherein the folded dipole microstrip antenna 120 consists of two meander paths 122, 124, each having mirror geometry about the second central axis 118, wherein the two meander paths enclose a shared aperture therebetween. The method includes leaving a first gap 126 between the two meander paths near the third edge 112. The method includes leaving a second gap 128 between the two meander paths near the fourth edge 114. The method includes inserting a lumped inductor 132 across the first gap 126 near the third edge 112. The method includes printing, with metal, a first pair of parallel metallic patches (134, 136) on the bottom side 106, wherein the first pair of parallel metallic patches (134, 136) extends from the first edge 108 towards the first central axis 116, wherein the first pair of parallel metallic patches (134, 136) has a mirror geometry about the first central axis. The method includes connecting a first feed port terminal of the first feed port 138 to a first patch of the first pair of metallic patches at the first edge 108, wherein the first patch of the first pair of metallic patches is located near the third edge 112. The method includes connecting a second feed port terminal of the first feed port 138 to the dielectric circuit board. The method includes printing, with metal, a second pair of parallel metallic patches (144, 146) on the bottom side 106, wherein the second pair of parallel metallic patches (144, 146) extends for a second length from the third edge 112 towards the fourth edge 114, wherein the second pair of parallel metallic patches (144, 146) has mirror geometry about the second central axis. The method includes connecting a first feed port terminal of a second feed port 148 to a first patch of the second pair of metallic patches at the third edge 112, wherein the first patch of the second pair of metallic patches is located between the first patch of the first pair of metallic patches and the second central axis 118. The method includes connecting a second feed port terminal of the second feed port 148 to the dielectric circuit board. The method includes printing, with metal, a third pair of parallel metallic patches (154, 156) on the bottom side 106, wherein the third pair of parallel metallic patches (154, 156) extends from the second edge 110 towards the second central axis 118, wherein the third pair of parallel metallic patches (154, 156) has a mirror geometry about the first central axis. The method includes applying a first input signal at the first feed port 138 and a second input signal at the second feed port 148, wherein the first input signal and the second input signal cause the shared aperture multi-band antenna to resonate in a dual band frequency range comprising a first resonance band in a range of 0.4 GHz to 0.6 GHz and a second resonance band in a range of 4.7 GHZ to 5.8 GHz.

In an aspect, the step of printing, with metal, a first meander path of the two meander paths includes printing, with metal, a first leg parallel to the third edge 112, wherein the first leg extends from the first gap 126 towards the first edge 108. The method further includes printing, with metal, a second leg perpendicular to the first leg and parallel to the first edge 108, wherein the second leg is spaced from the first edge 108 by a third gap. The method further includes printing, with metal, a third leg perpendicular to the second leg and parallel to the first leg, wherein the third leg extends to the second gap 128. The method further includes printing, with metal, an arm perpendicular to the third leg, wherein the arm extends from the third leg toward the fourth edge 114.

In an aspect, the method further includes printing, with metal, a second meander path of the two meander paths includes printing, with metal, a first leg parallel to the third edge 112, wherein the first leg extends from the first gap 126 towards the second edge 110. The method further includes printing, with metal, a second leg perpendicular to the first leg and parallel to the second edge 110, wherein the second leg is spaced from the second edge 110 by a third gap. The method further includes printing, with metal, a third leg perpendicular to the second leg and parallel to the first leg, wherein the third leg extends towards the second gap 128. The method further includes printing, with metal, an arm perpendicular to the third leg.

The third embodiment is illustrated with respect to FIG. 1A-FIG. 1B. The third embodiment describes a method for transmitting signals with a shared aperture multi-band antenna. The method includes connecting an input signal to a first feed port 138 and a second feed port 148 located on the shared aperture multi-band antenna. The shared aperture multi-band antenna includes a dielectric circuit board 102 including a top side 104, a bottom side 106, a first edge 108, a second edge 110 parallel to the first edge 108, a third edge 112 perpendicular to the first edge 108 and the second edge 110, and a fourth edge 114 parallel to the third edge 112, a first central axis 116 which extends from the first edge 108 to the second edge 110, and a second central axis 118 which extends from the third edge 112 to the fourth edge 114; a folded dipole microstrip antenna 120 formed on the top side 104, wherein the folded dipole microstrip antenna 120 consists of two meander paths, each having mirror geometry about the second central axis 118, wherein the two meander paths enclose a shared aperture therebetween; a first gap 126 located between the two meander paths near the third edge 112; a second gap 128 located between the two meander paths near the fourth edge 114; a lumped inductor 132 inserted across the first gap 126 near the third edge 112; a first pair of parallel metallic patches (134, 136) located on the bottom side 106, wherein the first pair of parallel metallic patches (134, 136) extends from the first edge 108 towards the second central axis 118, wherein the first pair of parallel metallic patches (134, 136) has a mirror geometry about the first central axis; wherein the first feed port 138 is connected by a first feed port terminal to a first patch of the first pair of metallic patches at the first edge 108, wherein the first patch of the first pair of metallic patches is located near the third edge 112, wherein the first feed port 138 is connected by a second feed port terminal to the dielectric circuit board; a second pair of parallel metallic patches (144, 146) located on the bottom side 106, wherein the second pair of parallel metallic patches (144, 146) extends for a second length from the third edge 112 towards the fourth edge 114, wherein the second pair of parallel metallic patches (144, 146) has mirror geometry about the second central axis; wherein the second feed port 148 is connected by a first feed port terminal to a first patch of the second pair of metallic patches at the third edge 112, wherein the first patch of the second pair of metallic patches is located between the first patch of the first pair of metallic patches and the second central axis 118, wherein the second feed port 148 is connected by a second feed port terminal to the dielectric circuit board; and a third pair of parallel metallic patches (154, 156) located on the bottom side 106, wherein the third pair of parallel metallic patches (154, 156) extends from the second edge 110 towards the second central axis 118, wherein the third pair of parallel metallic patches (154, 156) have a mirror geometry about the first central axis. The method further includes resonating, by the input signal, the shared aperture multi-band antenna in a dual band frequency range comprising a first resonance band in a range of 0.4 GHz to 0.6 GHz and a second resonance band in a range of 4.7 GHz to 5.8 GHz.

In an aspect, the first meander path of the two meander paths includes a first leg parallel to the third edge 112, wherein the first leg extends from the first gap 126 towards the first edge 108; a second leg perpendicular to the first leg and parallel to the first edge 108, wherein the second leg is spaced from the first edge 108 by a third gap; a third leg perpendicular to the second leg and parallel to the first leg, wherein the third leg extends to the second gap 128; and an arm perpendicular to the third leg, wherein the arm extends from the third leg toward the fourth edge 114. The second meander path of the two paths is configured to mirror the first meander path across the second central axis 118.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A shared aperture multi-band antenna, comprising:
a dielectric circuit board including a top side, a bottom side, a first edge, a second edge parallel to the first edge, a third edge perpendicular to the first edge and the second edge, and a fourth edge parallel to the third edge, a first central axis which extends from the first edge to the second edge, and a second central axis which extends from the third edge to the fourth edge;
a folded dipole microstrip antenna formed on the top side, wherein the folded dipole microstrip antenna consists of two meander paths, each having mirror geometry about the second central axis, wherein the two meander paths enclose a shared aperture therebetween;
a first gap located between the two meander paths near the third edge;
a second gap located between the two meander paths near the fourth edge;
a lumped inductor inserted across the first gap near the third edge;
a first pair of parallel metallic patches located on the bottom side, wherein the first pair of parallel metallic patches extends from the first edge towards the second central axis, wherein the first pair of parallel metallic patches has a mirror geometry about the first central axis;
a first feed port connected by a first feed port terminal to a first patch of the first pair of metallic patches at the first edge, wherein the first patch of the first pair of metallic patches is located near the third edge, wherein the first feed port is connected by a second feed port terminal to the dielectric circuit board;
a second pair of parallel metallic patches located on the bottom side, wherein the second pair of parallel metallic patches extends for a second length from the third edge towards the fourth edge, wherein the second pair of parallel metallic patches has mirror geometry about the second central axis;
a second feed port connected by a first feed port terminal to a first patch of the second pair of metallic patches at the third edge, wherein the first patch of the second pair of metallic patches is located between the first patch of the first pair of metallic patches and the second central axis, wherein the second feed port is connected by a second feed port terminal to the dielectric circuit board; and
a third pair of parallel metallic patches located on the bottom side, wherein the third pair of parallel metallic patches extends from the second edge towards the second central axis, wherein the third pair of parallel metallic patches have a mirror geometry about the first central axis,
wherein the shared aperture multi-band antenna is configured to resonate in a dual band frequency range comprising a first resonance band in a range of 0.4 GHz to 0.6 GHz and a second resonance band in a range of 4.7 GHZ to 5.8 GHz upon application of an input signal at both the first feed port and the second feed port.

2. The shared aperture multi-band antenna of claim 1, wherein:
the first meander path comprises:
a first leg parallel to the third edge, wherein the first leg extends from the first gap towards the first edge;
a second leg perpendicular to the first leg and parallel to the first edge, wherein the second leg is spaced from the first edge by a third gap;
a third leg perpendicular to the second leg and parallel to the first leg, wherein the third leg extends to the second gap; and
an arm perpendicular to the third leg, wherein the arm extends from the third leg toward the fourth edge.

3. The shared aperture multi-band antenna of claim 2, wherein a length of the arm is about 5 mm.

4. The shared aperture multi-band antenna of claim 2, wherein a length of the arm is selected from a range of about 2 mm to about 5 mm.

5. The shared aperture multi-band antenna of claim 2, wherein the first gap is about 0.6 mm, the second gap is about 0.6 mm and the third gap is about 1.0 mm.

6. The shared aperture multi-band antenna of claim 2, wherein:
a width of the microstrip is about 1.20 mm;
a length of the first leg is about 7.3 mm;
a length of the second leg is about 3.60 mm;
a length of the third leg is about 7.3 mm; and
a length of the arm is about 5.0 mm.

7. The shared aperture multi-band antenna of claim 1, wherein:
the second meander path comprises:
a first leg parallel to the third edge, wherein the first leg extends from the first gap towards the second edge;
a second leg perpendicular to the first leg and parallel to the second edge, wherein the second leg is spaced from the second edge by a third gap;
a third leg perpendicular to the second leg and parallel to the first leg, wherein the third leg extends towards the second gap; and
an arm perpendicular to the third leg.

8. The shared aperture multi-band antenna of claim 7, wherein the first gap is about 0.6 mm, the second gap is about 0.6 mm and the third gap is about 1.00 mm.

9. The shared aperture multi-band antenna of claim 1, wherein the dielectric circuit board has dimensions of:
about 16.40 mm from the first edge to the second edge along the first central axis;
about 10.50 mm from the third edge to the fourth edge along the second central axis; and
about 1.52 mm in a depth direction from the top side to the bottom side.

10. The shared aperture multi-band antenna of claim 1, wherein the second length of the second pair of metallic patches is selected from a range of about 1.5 mm to about 7.55 mm.

11. The shared aperture multi-band antenna of claim 1, wherein a width of each metallic patch of the first pair of metallic patches and the third pair of metallic patches is selected from a range of about 2 mm to about 5 mm.

12. The shared aperture multi-band antenna of claim 1, wherein an inductance value of the lumped inductor is selected from a range of 50 nH to 200 nH.

13. The shared aperture multi-band antenna of claim 1, wherein the shared aperture multi-band antenna is configured to resonate at a frequency of about 5.8 GHz upon application of an input signal at only the first feed port.

14. The shared aperture multi-band antenna of claim 1, wherein the shared aperture multi-band antenna is configured to resonate at frequencies of about 434 MHz and 4.8 GHz upon application of an input signal at only the second feed port.

15. The shared aperture multi-band antenna of claim 1, wherein an input impedance at each feed port is about 50 ohms.

16. A method for making a shared aperture multi-band antenna, comprising:
obtaining a dielectric circuit board including a top side, a bottom side, a first edge, a second edge parallel to the first edge, a third edge perpendicular to the first edge and the second edge, and a fourth edge parallel to the third edge, a first central axis which extends from the first edge to the second edge, and a second central axis which extends from the third edge to the fourth edge;
printing, with metal, a folded dipole microstrip antenna on the top side, wherein the folded dipole microstrip antenna consists of two meander paths, each having mirror geometry about the second central axis, wherein the two meander paths enclose a shared aperture therebetween;
leaving a first gap between the two meander paths near the third edge;
leaving a second gap between the two meander paths near the fourth edge;
inserting a lumped inductor across the first gap near the third edge;
printing, with metal, a first pair of parallel metallic patches on the bottom side, wherein the first pair of parallel metallic patches extends from the first edge towards the first central axis, wherein the first pair of parallel metallic patches has a mirror geometry about the first central axis;
connecting a first feed port terminal of the first feed port to a first patch of the first pair of metallic patches at the first edge, wherein the first patch of the first pair of metallic patches is located near the third edge;
connecting a second feed port terminal of the first feed port to the dielectric circuit board;
printing, with metal, a second pair of parallel metallic patches on the bottom side, wherein the second pair of parallel metallic patches extends for a second length from the third edge towards the fourth edge, wherein the second pair of parallel metallic patches has mirror geometry about the second central axis;
connecting a first feed port terminal of a second feed port to a first patch of the second pair of metallic patches at the third edge, wherein the first patch of the second pair of metallic patches is located between the first patch of the first pair of metallic patches and the second central axis;
connecting a second feed port terminal of the second feed port to the dielectric circuit board;
printing, with metal, a third pair of parallel metallic patches on the bottom side, wherein the third pair of parallel metallic patches extends from the second edge towards the second central axis, wherein the third pair of parallel metallic patches has a mirror geometry about the first central axis; and
applying a first input signal at the first feed port and a second input signal at the second feed port, wherein the first input signal and the second input signal cause the shared aperture multi-band antenna to resonate in a dual band frequency range comprising a first resonance band in a range of 0.4 GHz to 0.6 GHz and a second resonance band in a range of 4.7 GHz to 5.8 GHz.

17. The method of claim 16, wherein printing, with metal, a first meander path of the two meander paths comprises:
printing, with metal, a first leg parallel to the third edge, wherein the first leg extends from the first gap towards the first edge;
printing, with metal, a second leg perpendicular to the first leg and parallel to the first edge, wherein the second leg is spaced from the first edge by a third gap;
printing, with metal, a third leg perpendicular to the second leg and parallel to the first leg, wherein the third leg extends to the second gap; and
printing, with metal, an arm perpendicular to the third leg, wherein the arm extends from the third leg toward the fourth edge.

18. The method of claim 16, wherein printing, with metal, a second meander path of the two meander paths comprises:
printing, with metal, a first leg parallel to the third edge, wherein the first leg extends from the first gap towards the second edge;
printing, with metal, a second leg perpendicular to the first leg and parallel to the second edge, wherein the second leg is spaced from the second edge by a third gap;
printing, with metal, a third leg perpendicular to the second leg and parallel to the first leg, wherein the third leg extends towards the second gap; and
printing, with metal, an arm perpendicular to the third leg.

19. A method for transmitting signals with a shared aperture multi-band antenna, comprising:
connecting an input signal to a first feed port and a second feed port located on the shared aperture multi-band antenna, wherein the shared aperture multi-band antenna includes:
a dielectric circuit board including a top side, a bottom side, a first edge, a second edge parallel to the first edge, a third edge perpendicular to the first edge and the second edge, and a fourth edge parallel to the third edge, a first central axis which extends from the first edge to the second edge, and a second central axis which extends from the third edge to the fourth edge;
a folded dipole microstrip antenna formed on the top side, wherein the folded dipole microstrip antenna consists of two meander paths, each having mirror geometry about the second central axis, wherein the two meander paths enclose a shared aperture therebetween;
a first gap located between the two meander paths near the third edge;
a second gap located between the two meander paths near the fourth edge;
a lumped inductor inserted across the first gap near the third edge;
a first pair of parallel metallic patches located on the bottom side, wherein the first pair of parallel metallic patches extends from the first edge towards the first central axis, wherein the first pair of parallel metallic patches has a mirror geometry about the first central axis;
wherein the first feed port is connected by a first feed port terminal to a first patch of the first pair of metallic patches at the first edge, wherein the first patch of the first pair of metallic patches is located near the third edge, wherein the first feed port is connected by a second feed port terminal to the dielectric circuit board;
a second pair of parallel metallic patches located on the bottom side, wherein the second pair of parallel metallic patches extends for a second length from the third edge towards the fourth edge, wherein the second pair of parallel metallic patches has mirror geometry about the second central axis;

wherein the second feed port is connected by a first feed port terminal to a first patch of the second pair of metallic patches at the third edge, wherein the first patch of the second pair of metallic patches is located between the first patch of the first pair of metallic patches and the second central axis, wherein the second feed port is connected by a second feed port terminal to the dielectric circuit board; and a third pair of parallel metallic patches located on the bottom side, wherein the third pair of parallel metallic patches extends from the second edge towards the second central axis, wherein the third pair of parallel metallic patches have a mirror geometry about the first central axis, resonating, by the input signal, the shared aperture multi-band antenna in a dual band frequency range comprising a first resonance band in a range of 0.4 GHz to 0.6 GHz and a second resonance band in a range of 4.7 GHZ to 5.8 GHz.

20. The method of claim 19, wherein:

the first meander path of the two meander paths comprises:

a first leg parallel to the third edge, wherein the first leg extends from the first gap towards the first edge;

a second leg perpendicular to the first leg and parallel to the first edge, wherein the second leg is spaced from the first edge by a third gap;

a third leg perpendicular to the second leg and parallel to the first leg, wherein the third leg extends to the second gap;

an arm perpendicular to the third leg, wherein the arm extends from the third leg toward the fourth edge; and the second meander path of the two paths is configured to mirror the first meander path across the second central axis.

* * * * *